(12) United States Patent
Tagami et al.

(10) Patent No.: US 11,729,973 B2
(45) Date of Patent: Aug. 15, 2023

(54) SEMICONDUCTOR MEMORY

(71) Applicant: KIOXIA CORPORATION, Tokyo (JP)

(72) Inventors: Masayoshi Tagami, Kuwana (JP); Jun Iijima, Yokkaichi (JP); Ryota Katsumata, Yokkaichi (JP); Kazuyuki Higashi, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 242 days.

(21) Appl. No.: 17/160,563

(22) Filed: Jan. 28, 2021

(65) Prior Publication Data

US 2021/0151465 A1 May 20, 2021

Related U.S. Application Data

(63) Continuation of application No. 16/927,309, filed on Jul. 13, 2020, now Pat. No. 10,950,630, which is a
(Continued)

(30) Foreign Application Priority Data

Sep. 19, 2017 (JP) .................................. 2017-179348

(51) Int. Cl.
*H01L 23/522* (2006.01)
*H10B 43/27* (2023.01)
(Continued)

(52) U.S. Cl.
CPC ......... *H10B 43/27* (2023.02); *H01L 23/5226* (2013.01); *H01L 24/04* (2013.01);
(Continued)

(58) Field of Classification Search
CPC ....... H01L 2924/00; H01L 2924/00014; H01L 2224/73265; H01L 2924/00012; H01L 25/0657
See application file for complete search history.

(56) References Cited

U.S. PATENT DOCUMENTS 9,305,968 B2 * 4/2016 Qian ................. H01L 27/14683
9,368,508 B2  6/2016 Jee et al.
(Continued)

FOREIGN PATENT DOCUMENTS

JP  2011-204829  10/2011
JP  2016-62901   4/2016

*Primary Examiner* — Jaehwan Oh

(74) *Attorney, Agent, or Firm* — Oblon, McClelland, Maier & Neustadt, L.L.P.

(57) ABSTRACT

According to one embodiment, a semiconductor memory device includes a first memory chip, a circuit chip, and an external connection electrode on a surface of the first memory chip. The first memory chip comprises first conductors stacked via an insulator, and a first pillar passing the first conductors. The circuit chip comprises a substrate, a control circuit, and a second conductor connected to the control circuit, the circuit chip being attached to the first memory chip. The external connection electrode comprises a portion extending from a side of the surface of the first memory chip through the first memory chip and connected to the second conductor. Part of the first conductors is between the external connection electrode and the substrate.

13 Claims, 24 Drawing Sheets

Related U.S. Application Data continuation of application No. 16/707,646, filed on Dec. 9, 2019, now Pat. No. 10,748,928, which is a continuation of application No. 16/460,410, filed on Jul. 2, 2019, now Pat. No. 10,553,612, which is a continuation of application No. 15/911,369, filed on Mar. 5, 2018, now Pat. No. 10,381,374.

(51) Int. Cl.

| | | |
|---|---|---|
| *H01L 25/065* | (2023.01) | |
| *H01L 23/00* | (2006.01) | |
| *H10B 43/10* | (2023.01) | |
| *H10B 43/35* | (2023.01) | |
| *H10B 43/40* | (2023.01) | |
| *G11C 16/26* | (2006.01) | |
| *G11C 5/02* | (2006.01) | |
| *G11C 16/04* | (2006.01) | |

(52) U.S. Cl.
CPC ......... *H01L 25/0657* (2013.01); *H10B 43/10* (2023.02); *H10B 43/35* (2023.02); *H10B 43/40* (2023.02); *G11C 5/02* (2013.01); *G11C 16/0483* (2013.01); *G11C 16/26* (2013.01); *H01L 24/05* (2013.01); *H01L 24/08* (2013.01); *H01L 24/80* (2013.01); *H01L 2224/05095* (2013.01); *H01L 2224/05569* (2013.01); *H01L 2224/05624* (2013.01); *H01L 2224/05647* (2013.01); *H01L 2224/08145* (2013.01); *H01L 2224/08146* (2013.01); *H01L 2224/80201* (2013.01); *H01L 2224/80894* (2013.01); *H01L 2224/80895* (2013.01); *H01L 2924/1304* (2013.01); *H01L 2924/13091* (2013.01); *H01L 2924/1434* (2013.01)

(56) References Cited

U.S. PATENT DOCUMENTS

| | | | |
|---|---|---|---|
| 9,432,298 B1* | 8/2016 | Smith | H04L 49/9057 |
| 9,558,945 B2 | 1/2017 | Fukuzumi et al. | |
| 9,691,782 B1* | 6/2017 | Hwang | H01L 27/11573 |
| 9,786,683 B1* | 10/2017 | Sakuma | H01L 23/528 |
| 9,865,541 B2* | 1/2018 | Kim | H10B 41/10 |
| 9,887,176 B2* | 2/2018 | Lou | H01L 23/3114 |
| 10,074,667 B1* | 9/2018 | Higashi | H01L 25/0657 |
| 10,381,374 B2* | 8/2019 | Tagami | H10B 43/40 |
| 10,553,612 B2* | 2/2020 | Tagami | H10B 43/27 |
| 10,748,928 B2* | 8/2020 | Tagami | H10B 43/10 |
| 10,950,630 B2* | 3/2021 | Tagami | H10B 43/27 |
| 2006/0022303 A1* | 2/2006 | Desai | H05K 1/16 |
| | | | 257/532 |
| 2011/0092038 A1* | 4/2011 | Choi | H01L 27/11578 |
| | | | 257/E21.295 |
| 2013/0052803 A1* | 2/2013 | Roizin | H01L 29/66825 |
| | | | 257/E21.09 |
| 2016/0071824 A1* | 3/2016 | Yoon | H01L 25/50 |
| | | | 257/738 |
| 2016/0079164 A1 | 3/2016 | Fukuzumi et al. | |
| 2016/0307910 A1* | 10/2016 | Son | H01L 27/11524 |
| 2016/0351472 A1* | 12/2016 | Park | H01L 25/0657 |
| 2017/0179027 A1* | 6/2017 | Kim | H01L 27/11529 |
| 2017/0179151 A1 | 6/2017 | Kai et al. | |
| 2017/0323898 A1* | 11/2017 | Oh | H01L 27/11575 |
| 2019/0139976 A1* | 5/2019 | Lee | H01L 27/11565 |

* cited by examiner

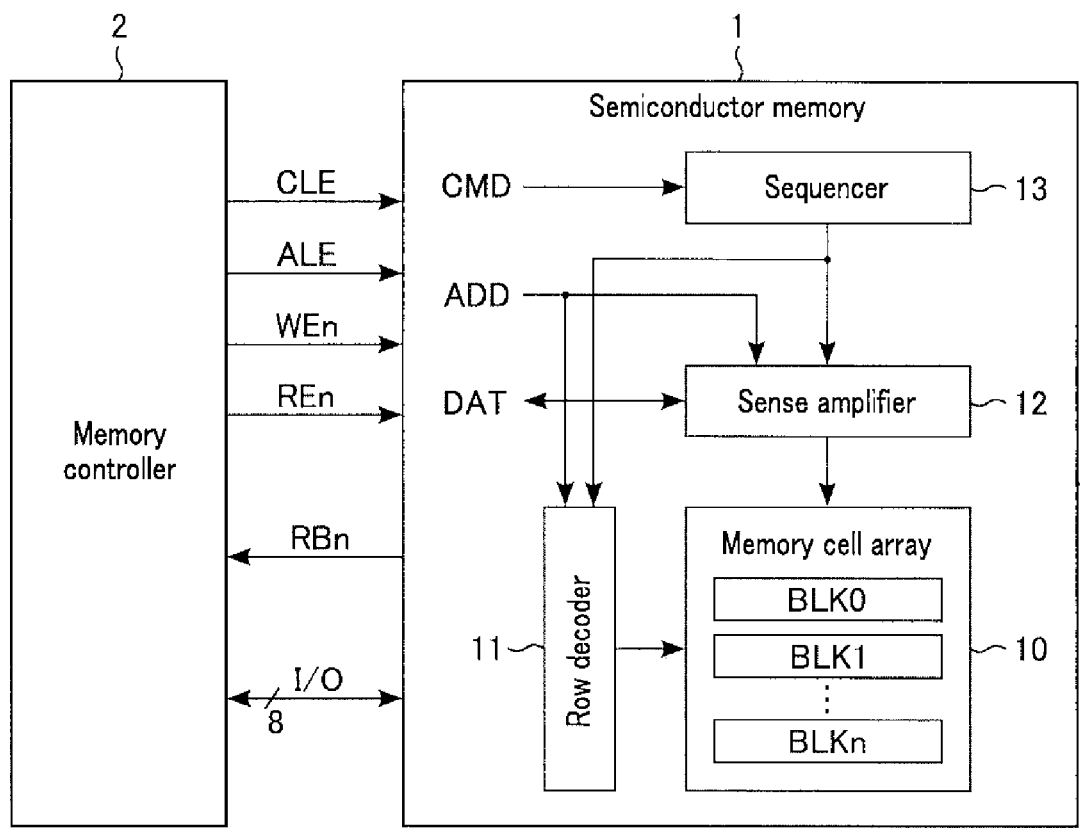
F I G. 1

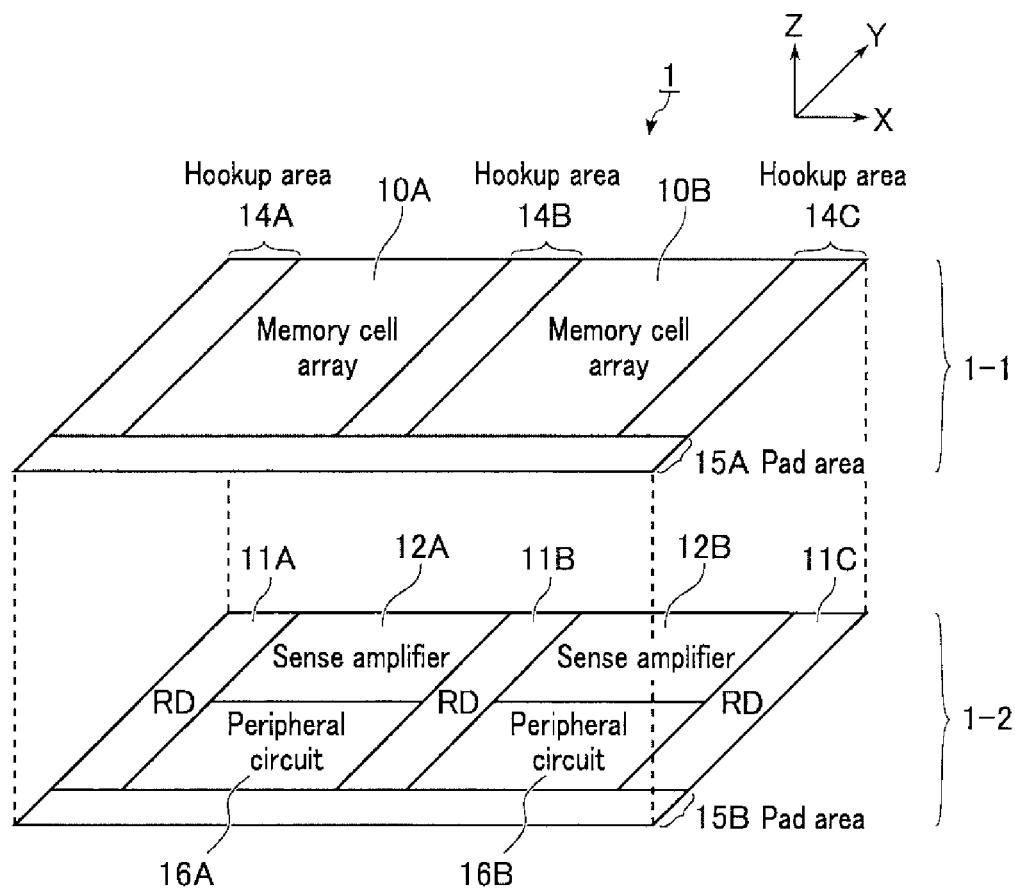
F I G. 3

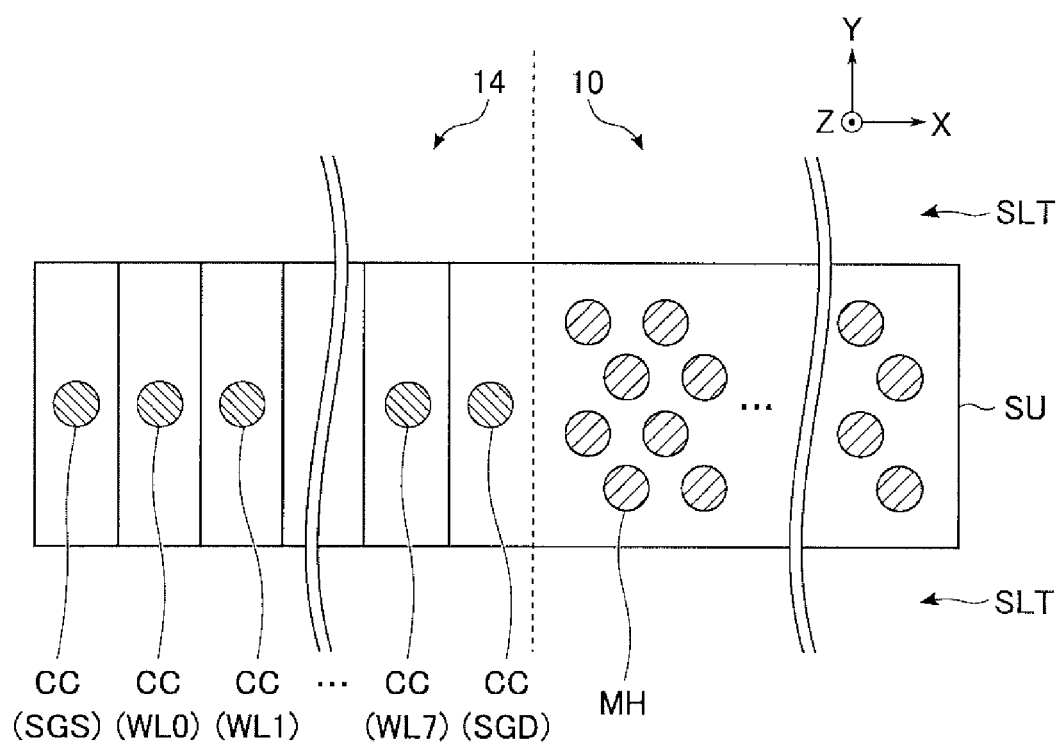
F I G. 5

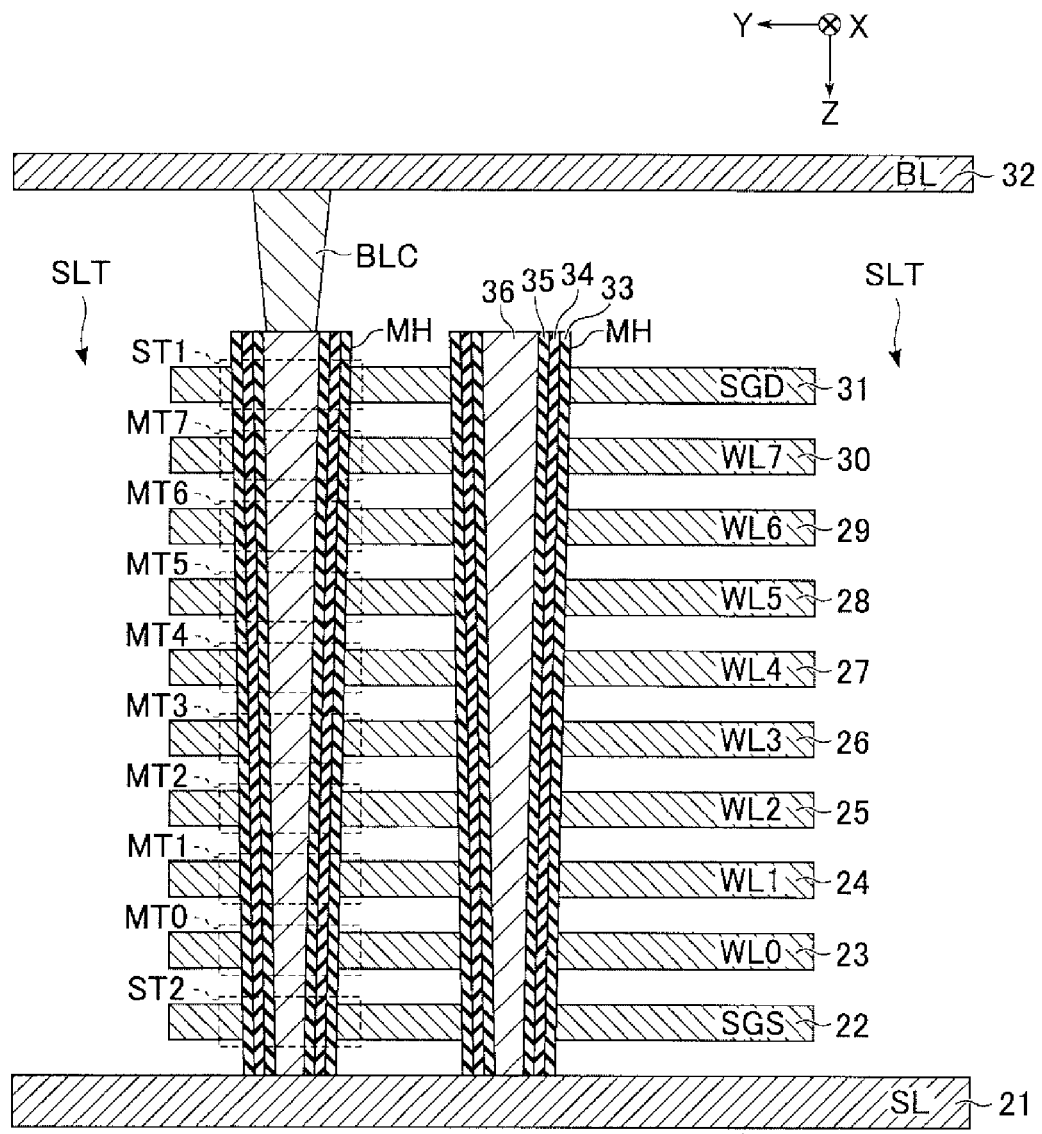
F I G. 7

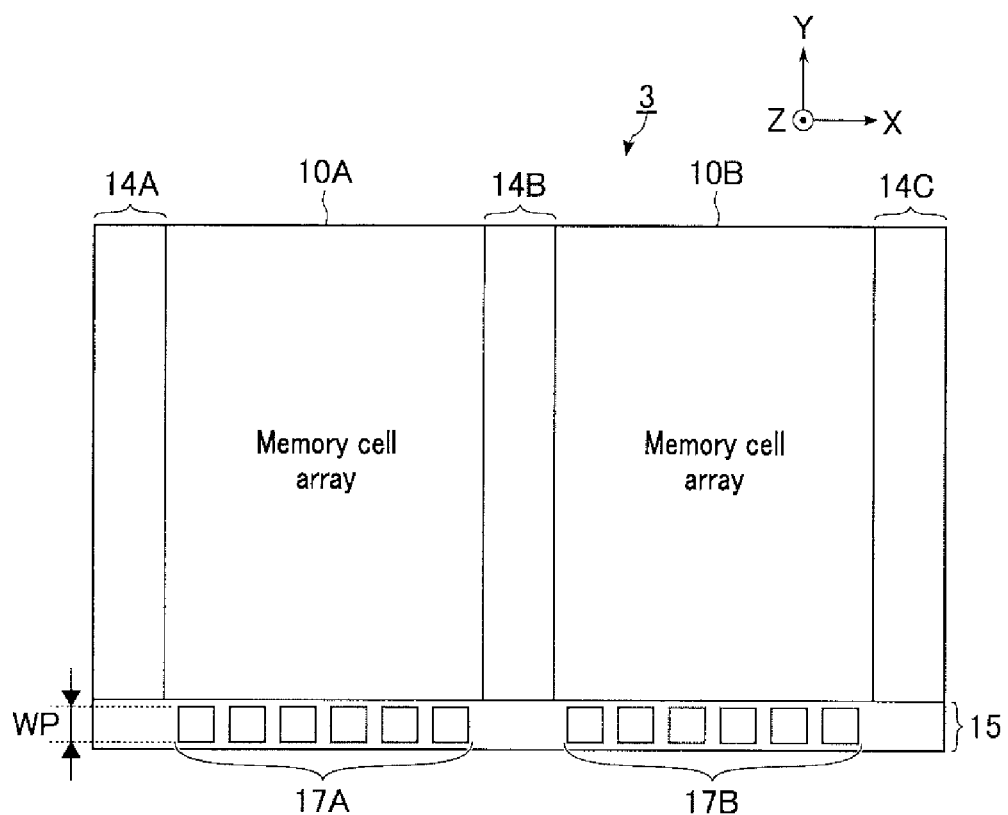
F I G. 16

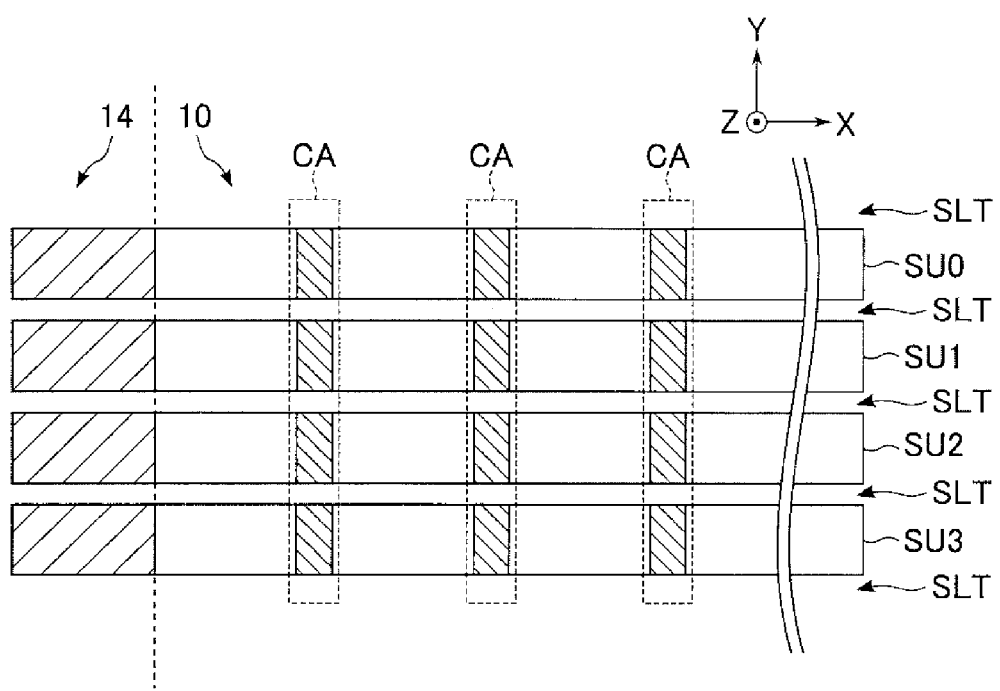
F I G. 19

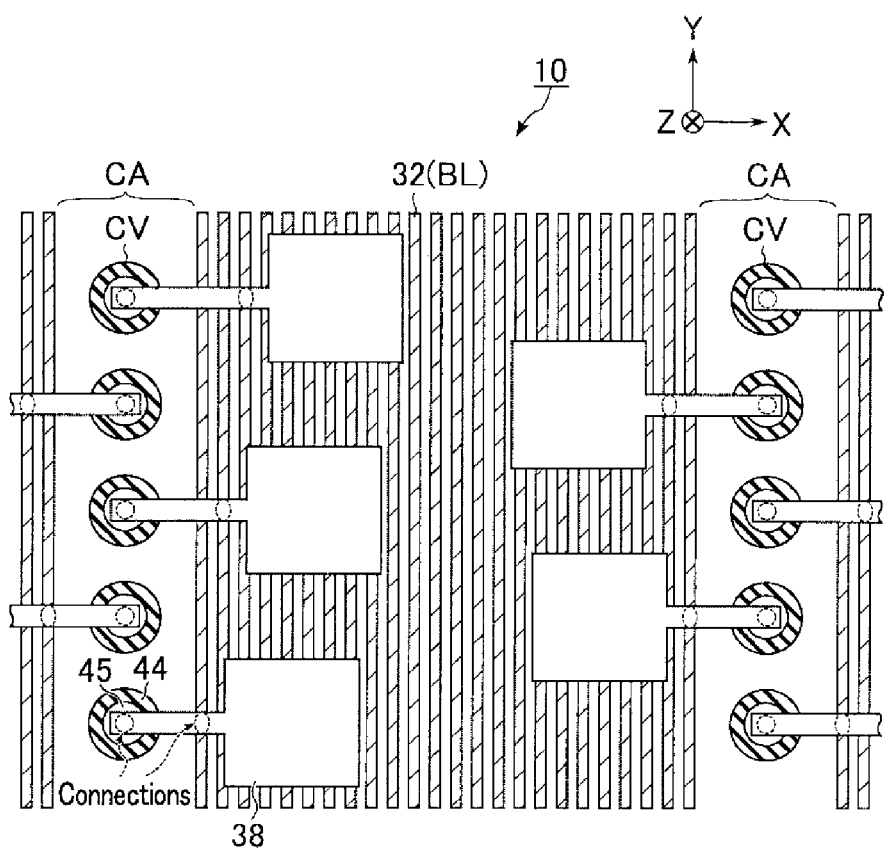
F I G. 20

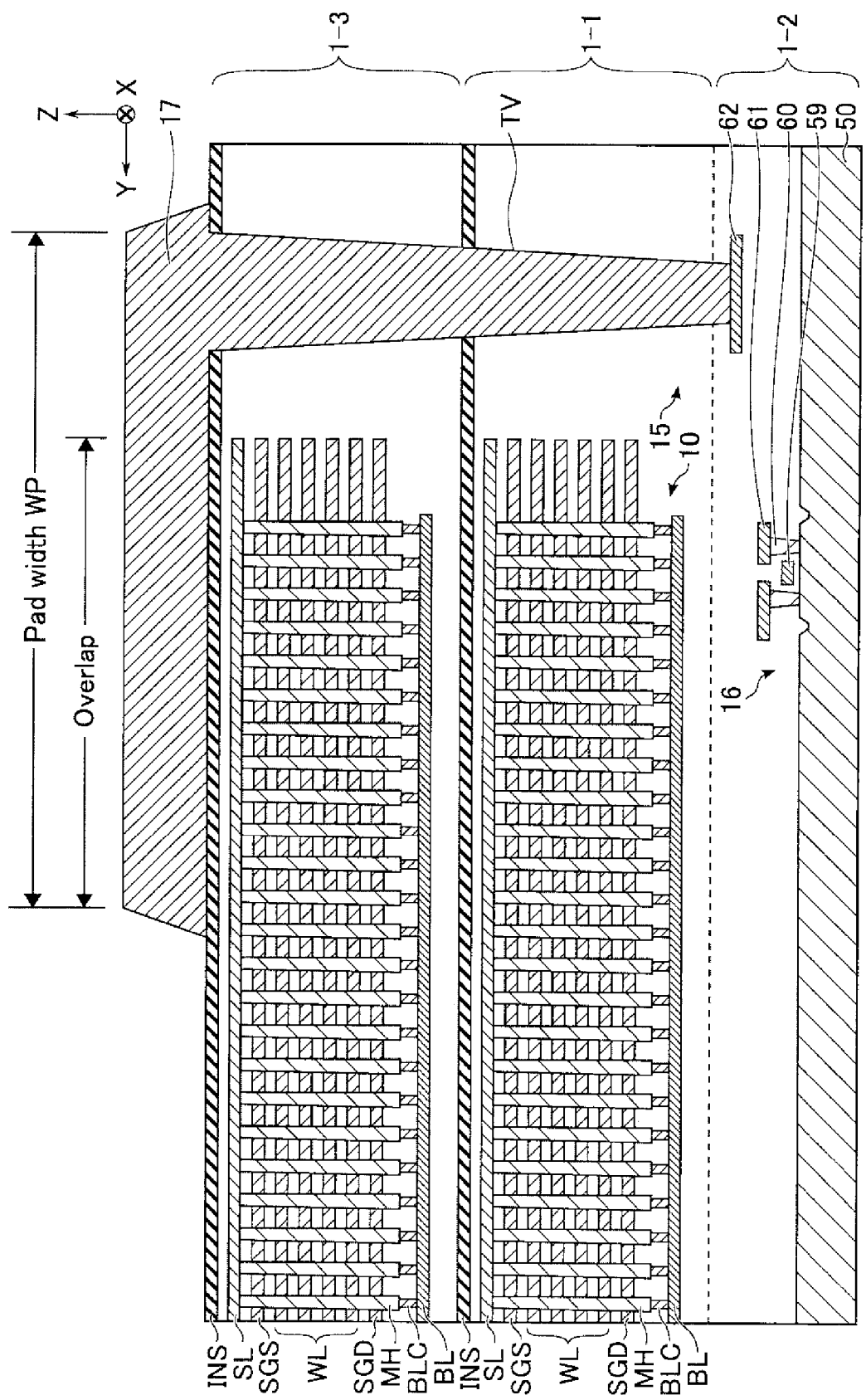
F I G. 22

SEMICONDUCTOR MEMORY

CROSS-REFERENCE TO RELATED APPLICATIONS

This application is a continuation of U.S. application Ser. No. 16/927,309, filed Jul. 13, 2020, which is a continuation of U.S. application Ser. No. 16/707,646 filed Dec. 9, 2019, which is a continuation of U.S. application Ser. No. 16/460,410 filed Jul. 2, 2019, which is a continuation of U.S. application Ser. No. 15/911,369 filed Mar. 5, 2018, and is based upon and claims the benefit of priority from Japanese Patent Application No. 2017-179348, filed Sep. 19, 2017, the entire contents of each of which are incorporated herein by reference.

FIELD

Embodiments described herein relate generally to a semiconductor memory.

BACKGROUND

NAND-type flash memories having three-dimensionally stacked memory cells are known.

BRIEF DESCRIPTION OF THE DRAWINGS

FIG. 1 is a block diagram showing a configuration example of a semiconductor memory according to a first embodiment.

FIG. 3 shows one example of the planar layout of the semiconductor memory according to the first embodiment.

FIG. 5 shows one example of the detailed planar layout of the memory cell array and a hookup area in the semiconductor memory according to the first embodiment.

FIG. 7 shows one example of the sectional configuration of the memory cell array in the semiconductor memory according to the first embodiment.

FIG. 16 shows one example of the planar layout of a semiconductor memory according to a comparative example of the first embodiment.

FIG. 19 shows one example of the detailed planar layout of a memory cell array and a hookup area in a semiconductor memory according to a third embodiment.

FIG. 20 shows one example of the detailed planar layout of the memory cell array in the semiconductor memory according to the third embodiment.

FIG. 22 shows one example of the sectional configuration of the memory cell array and a pad area in the semiconductor memory according to the third embodiment.

DETAILED DESCRIPTION

Figure 2:
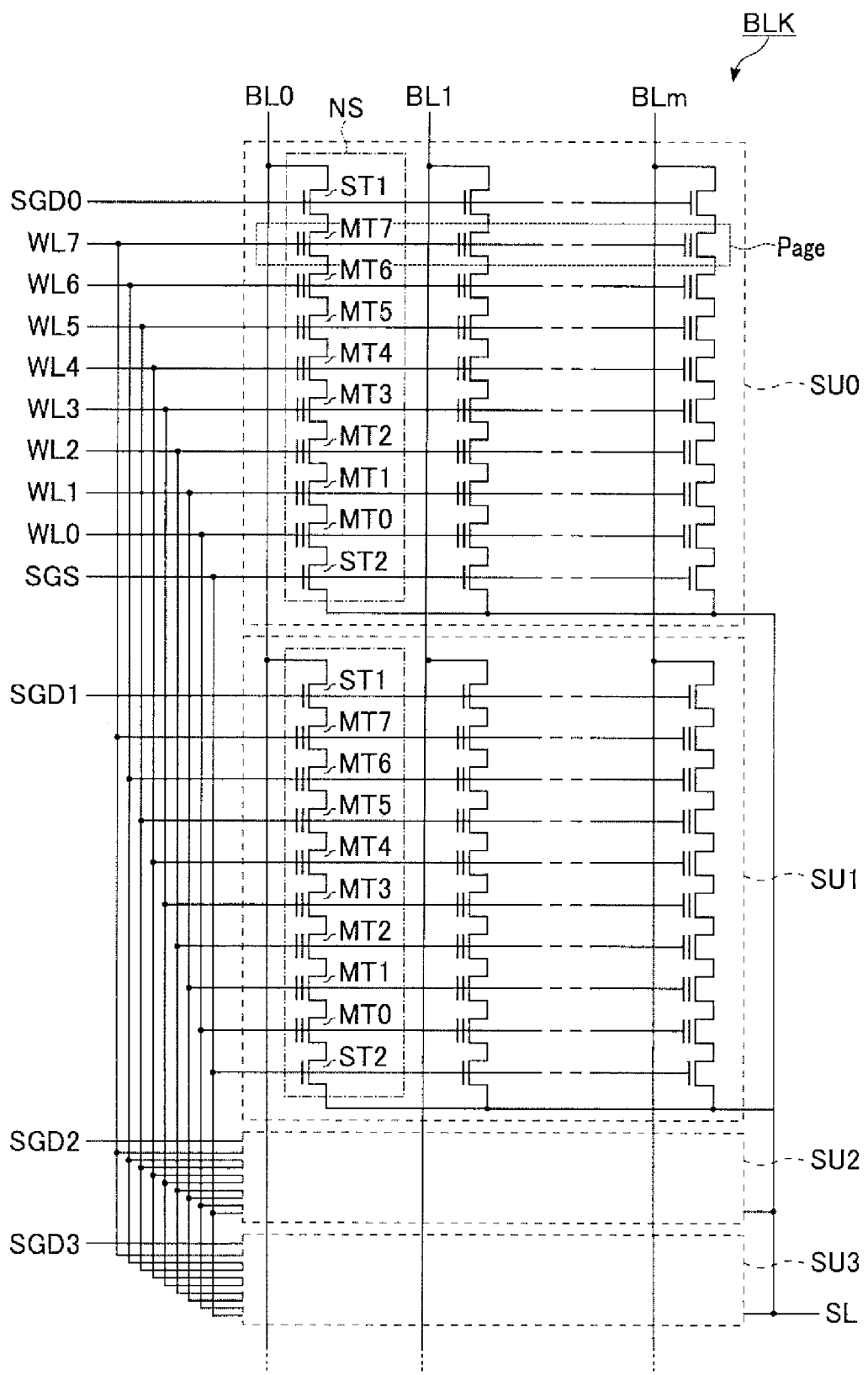
FIG. 2 shows one example of the circuit configuration of a memory cell array in the semiconductor memory according to the first embodiment.

A semiconductor memory according to an embodiment includes a first memory chip, a circuit chip, and an external connection electrode. The first memory chip includes a plurality of first conductors stacked via an insulator, and a first pillar passing the first conductors and forming intersections with the first conductors. Each of the intersections functions as a memory cell. The circuit chip includes a substrate, a control circuit formed on the substrate, and a second conductor connected to the control circuit. The circuit chip is attached to the first memory chip. The external connection electrode is provided on a surface of the first memory chip, and includes a portion extending from a side of the surface of the first memory chip through the first memory chip and connected to the second conductor. Part of the first conductors is included between the external connection electrode and the substrate.

Hereinafter, embodiments will be described with reference to the accompanying drawings. The drawings are schematic. Each embodiment will exemplify devices and methods for embodying the technical idea of the invention. In the following descriptions, same reference symbols may be used for the components having substantially the same functions and configurations. Numerals may be added after reference symbol-constituting characters in order to differentiate the elements that are denoted by reference symbols containing the same characters and that have substantially the same configurations. If it is unnecessary to differentiate the elements denoted by reference symbols containing the same characters, these elements will be indicated simply by reference symbols containing only the same characters.

1 First Embodiment

The semiconductor memory according to the first embodiment will be described.

1-1 Configurations

[1-1-1] General Configuration of Semiconductor Memory 1

FIG. 1 shows a configuration example of a semiconductor memory 1 according to the first embodiment. The semiconductor memory 1 is a NAND-type flash memory capable of nonvolatile storage of data. The semiconductor memory 1 includes, for example, a memory cell array 10, a row decoder 11, a sense amplifier 12, and a sequencer 13, as shown in FIG. 1.

The memory cell array 10 includes a plurality of blocks BLK0 to BLKn (n being an integer of 1 or greater). The block BLK is a group of nonvolatile memory cells and handled as, for example, a unit for data erasure. The memory cell array 10 includes a plurality of bit lines and word lines, in which each memory cell is associated with one bit line and one word line. The detailed configuration of the memory cell array 10 will be described later.

The row decoder 11 selects one block BLK based on address information ADD received from an external memory controller 2. The row decoder 11 then applies given voltages to, for example, a selected word line and a non-selected word line, respectively.

The sense amplifier 12 applies a given voltage to each bit line in accordance with write data DAT received from the memory controller 2. The sense amplifier 12 also evaluates data stored in the memory cell based on the voltage of the bit line and sends the evaluated read data DAT to the memory controller 2.

The sequencer 13 controls the operation of the entire semiconductor memory 1 based on a command CMD received from the memory controller 2. Communications between the semiconductor memory 1 and the memory controller 2 support, for example, NAND interface standards. For example, the memory controller 2 sends a command latch enable signal CLE, an address latch enable signal ALE, a write enable signal WEn, and a read enable signal REn, and receives a ready/busy signal RBn. The memory controller 2 sends and receives an input/output signal I/O.

The signal CLE is a signal for informing the semiconductor memory 1 that a received signal I/O is a command CMD. The signal ALE is a signal for informing the semiconductor memory 1 that a received signal I/O is address information ADD. The signal WEn is a signal for instructing the semiconductor memory 1 to input a signal I/O. The signal REn is a signal for instructing the semiconductor memory 1 to output a signal I/O. The signal RBn is a signal for informing the memory controller 2 whether the semiconductor memory 1 is in a ready state to accept instructions from the memory controller 2 or in a busy state not to accept the instructions. The signal I/O may be, for example, an eight-bit signal and include a command CMD, address information ADD, data DAT, etc.

The semiconductor memory 1 and the memory controller 2 described above may be combined into a single semiconductor device. Such a semiconductor device may be a memory card (e.g., SD™ card), a solid state drive (SSD), and so on.

[1-1-2] Circuit Configuration of Memory Cell Array 10

FIG. 2 shows one example of the circuit configuration of the memory cell array 10 according to the first embodiment. With a focus on one block BLK, descriptions will be given of the circuit configuration of the memory cell array 10 according to the first embodiment.

The block BLK includes four string units SU0 to SU3 as shown in FIG. 2. Each string unit SU includes a plurality of NAND strings NSs associated with bit lines BL0 to BLm (m being an integer of 1 or greater), respectively. For example, the NAND string NS includes eight memory cell transistors MT0 to MT7 and select transistors ST1 and ST2.

The memory cell transistor MT includes a control gate and a charge accumulation layer, and holds data in a nonvolatile manner. The memory cell transistors MT0 to MT7 included in each NAND string NS are connected in series between the source of the select transistor ST1 and the drain of the select transistor ST2. The control gates of the memory cell transistors MT0s to MT7s in one block BLK have common connections to respective word lines WL0 to WL7. The group of 1-bit data stored by the multiple memory cell transistors MTs in each string unit SU, which are connected to the common word line WL, is called a "page".

The select transistors ST1s and ST2s are used for selecting string units SUs in various operations. The gates of the select transistors ST1s in each of the string units SU0 to SU3 in one block BLK have common connections to select gate lines SGD0 to SGD3, respectively. The drains of the select transistors ST1s that correspond to the same column in each block BLK have common connections to the respective corresponding bit lines BLs. The gates of the select transistors ST2s in one block BLK have common connections to a select gate line SGS. The sources of the select transistors ST2s in each block BLK have common connections to a source line SL between the multiple blocks BLKs.

The circuit configuration of the memory cell array 10 is not limited to the foregoing configuration. For example, the number of the string units SUs included in each block BLK, as well as the numbers of the memory cell transistors MTs and the select transistors ST1s and ST2s in each NAND string NS may be discretionarily set. The numbers of the word lines WLs and the select gate lines SGDs and SGSs may be varied based on the numbers of the memory cell transistors MTs and the select transistors ST1s and ST2s.

[1-1-3] Structure of Semiconductor Memory 1

FIG. 3 shows one example of the planar layout of the semiconductor memory 1 according to the first embodiment, in which an X-axis corresponds to the extending direction of the word lines WLs, a Y-axis corresponds to the extending direction of the bit lines BLs, and a Z-axis corresponds to the direction perpendicular to a substrate surface of the semiconductor memory 1. The semiconductor memory 1 includes, for example, a memory chip 1-1 and a circuit chip 1-2, as shown in FIG. 3.

The memory chip 1-1 functions as a substantive storage area of the semiconductor memory 1. The circuit chip 1-2 takes control over the communications with the memory controller 2 and functions as a control circuit for the memory chip 1-1. The memory chip 1-1 and the circuit chip 1-2 form circuits using semiconductor substrates different from one another. By arranging the memory chip 1-1 onto the circuit chip 1-2 and bonding the memory chip 1-1 and the circuit chip 1-2 together, one semiconductor chip (semiconductor memory 1) is formed.

The memory chip 1-1 includes, for example, memory cell arrays 10A and 10B, hookup areas 14A, 14B and 14C, and a pad area 15A. The circuit chip 1-2 includes, for example, row decoders 11A, 11B and 11C, sense amplifiers 12A and 12B, peripheral circuits 16A and 16B, and a pad area 15B.

In the memory chip 1-1, the memory cell arrays 10A and 10B are formed to be capable of executing different operations in parallel. In the memory chip 1-1, the memory cell arrays 10A and 10B are disposed between the hookup areas 14 arranged in the X direction. More specifically, the memory cell array 10A is disposed between the hookup areas 14A and 14B, and the memory cell array 10B is disposed between the hookup areas 14B and 14C.

The hookup area 14 is an area for the electrical connection between the memory cell array 10 provided in the memory chip 1-1 and the row decoder 11 provided in the circuit chip 1-2. When a configuration to drive the word lines WLs from one side is adopted, the hookup area 14 is disposed next to the memory cell array 10. When a configuration to drive the word lines WLs from both sides is adopted, the hookup areas 14 are disposed to sandwich the memory cell array 10.

The pad area 15A is an area for disposing a pad used for connecting the circuit chip 1-2 and the memory controller 2. The pad area 15A extends in the X direction and is formed adjacent to the memory cell arrays 10A and 10B.

In the circuit chip 1-2, the row decoders 11A, 11B, and 11C are provided to overlap with the respective hookup areas 14A, 14B, and 14C of the memory chip 1-1. For example, the row decoders 11A and 11B are electrically connected to the word lines WLs provided in the memory cell array 10A, and the row decoders 11B and 11C are electrically connected to the word lines WLs provided in the memory cell array 10B.

The sense amplifiers 12A and 12B are provided to overlap with the respective memory cell arrays 10A and 10B of the memory chip 1-1. For example, the sense amplifier 12A is electrically connected to the bit lines BLs provided in the memory cell array 10A, and the sense amplifier 12B is electrically connected to the bit lines BLs provided in the memory cell array 10B.

The peripheral circuit 16 includes, for example, the sequencer 13, an input/output circuit that controls communications between the semiconductor memory 1 and the memory controller 2, and so on. For example, the peripheral circuit 16A is disposed between the row decoders 11A and 11B, and adjacent to the sense amplifier 12A. The peripheral circuit 16B is disposed between the row decoders 11B and 11C, and adjacent to the sense amplifier 12B.

The pad area 15B is formed adjacent to the peripheral circuits 16A and 16B, and overlaps with the pad area 15A of the memory chip 1-1. In the pad area 15B, for example, lines or the like drawn from the input/output circuit in the peripheral circuits 16A and 16B are provided. These lines, etc. are drawn to the top face of the semiconductor memory 1 by a pad.

Figure 4:
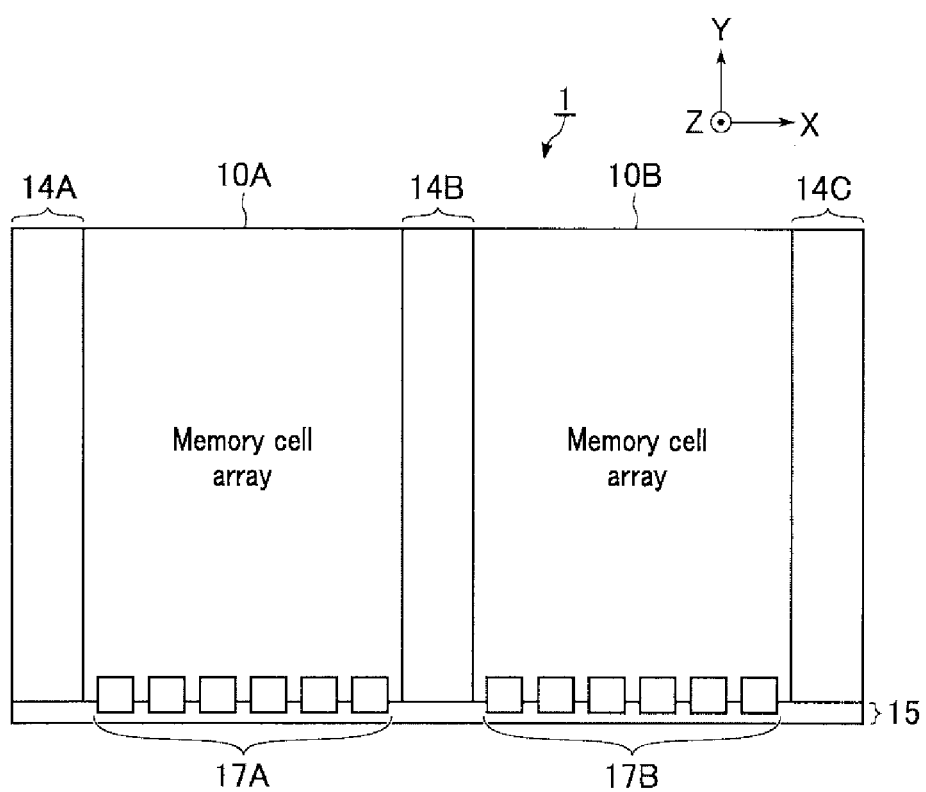
FIG. 4 shows one example of the planar layout of the semiconductor memory according to the first embodiment.

FIG. 4 shows the planar layout of the semiconductor memory 1 when the memory chip 1-1 and the circuit chip 1-2 have been bonded to each other. As shown in FIG. 4, the semiconductor memory 1 further includes a plurality of pads 17A and 17B arranged in the X direction.

The pads 17 are disposed on the surface of the memory chip 1-1 and used as external connection electrodes of the semiconductor memory 1. The pads 17A are connected to the peripheral circuit 16A (not shown) via the pad areas 15 of the memory chip 1-1 and the circuit chip 1-2. Similarly, the pads 17B are connected to the peripheral circuit 16B (not shown) via the pad areas 15. The pads 17A are disposed to overlap with the pad areas 15 and the memory cell array 10A, and the pads 17B are disposed to overlap with the pad areas 15 and the memory cell array 10B. As the pads 17, aluminum may be adopted, for example.

The foregoing descriptions have assumed an instance where two memory cell arrays 10 are provided. However, the number of the memory cell arrays 10 included in the memory chip 1-1 may be discretionarily set. In the semiconductor memory 1 according to the first embodiment, the layout for the row decoders 11, the sense amplifiers 12, the hookup areas 14, the pad areas 15, and the peripheral circuits 16 may be discretionarily changed based on the designs of the memory cell arrays 10.

FIG. 5 shows one example of a more detailed planar layout of the memory cell array 10 and the hookup area 14 in the semiconductor memory 1 according to the first embodiment. With a focus on one string unit SU, descriptions will be given of the structures of the memory cell array 10 and the hookup area 14 according to the first embodiment.

The semiconductor memory 1 is provided with a plurality of slits SLTs extending in the X direction, as shown in FIG. 5. The slits SLTs are arranged in the Y direction, and one string unit SU is disposed between the neighboring slits SLTs. In other words, the slit SLT is formed between the string units SUs positioned next to each other, and provides insulation between the neighboring string units SUs.

The string unit SU includes a plurality of semiconductor pillars MHs in the region of the memory cell array 10, and a plurality of contact plugs CCs in the hookup area 14. One semiconductor pillar MH corresponds to, for example, one NAND string NS. The contact plugs CCs are disposed to correspond to, for example, the word lines WL0 to WL7 and the select gate lines SGD and SGS, respectively.

Figure 6:
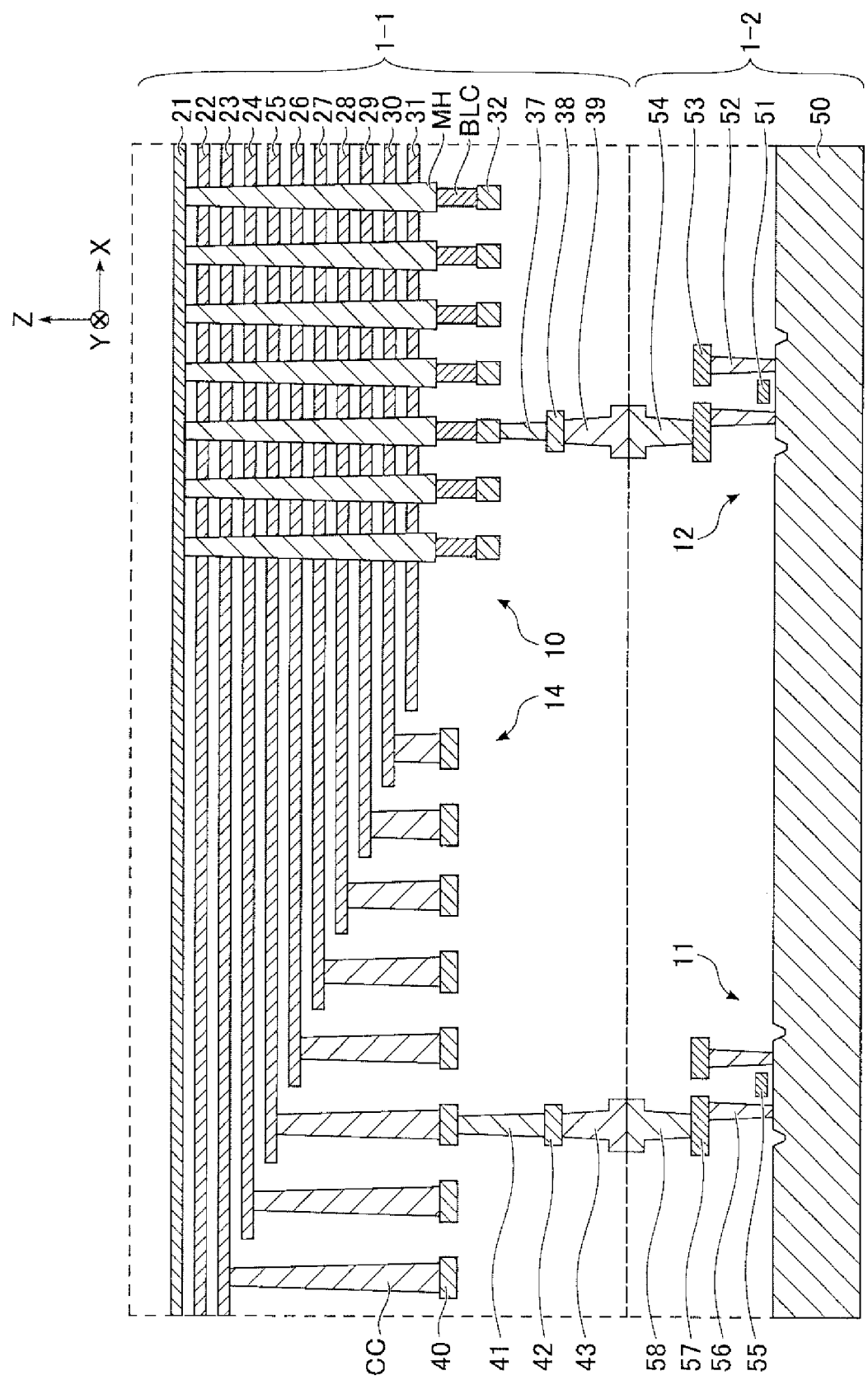
FIG. 6 shows one example of the sectional configuration of the memory cell array and the hookup area in the semiconductor memory according to the first embodiment.

FIG. 6 shows one example of the X direction-sectional structure of the memory cell array 10 and the hookup area 14 in the semiconductor memory 1 according to the first embodiment. Note that each sectional view that will be used in the following descriptions omits inter-layer insulation films as appropriate for descriptive purposes. In the semiconductor memory 1 according to the first embodiment, the memory chip 1-1 is provided above the circuit chip 1-2, as shown in FIG. 6.

First, the detailed structure of the memory chip 1-1 will be described. In the memory chip 1-1, conductors 21 to 31 are sequentially disposed from the top, with insulators provided between the respective conductors. The conductors 21 to 31 are each formed in a plate shape extending in the X direction and the Y direction. For example, the conductors 21 to 31 each extend to the hookup area 14 from the region of the memory cell array 10 so that they are arranged in a staircase manner in the hookup area 14. The conductor 21 functions as the source line SL. The conductor 22 functions as the select gate line SGS. The conductors 23 to 30 function as the respective word lines WL0 to WL7. The conductor 31 functions as the select gate line SGD.

The multiple semiconductor pillars MHs pass the conductors 31 to 22 in such a manner that they extend from the bottom face of the conductor 31 to reach the bottom face of the conductor 21. Conductive contact plugs BLCs are provided at the bottom faces of the respective semiconductor pillars MHs. Conductors 32 are provided at the bottom faces of the respective contact plugs BLCs. Each conductor 32 is linearly formed to extend in the Y direction, and functions as the bit line BL. One conductor 32 is electrically connected to one semiconductor pillar MH within each string unit SU.

Reference will be made to FIG. 7 to explain one example of a more detailed sectional structure of the memory cell array 10 in the semiconductor memory 1 according to the first embodiment. FIG. 7 corresponds to the section along the Y direction of FIG. 6, but the Z direction in FIG. 7 is reversed from FIG. 6.

A structure corresponding to one string unit SU is provided between the neighboring slits SLTs, as shown in FIG. 7. The slit SLT extends in the X direction and the Z direction, and provides insulation between the conductors 22 to 31 of one string unit SU and those of the neighboring string unit SU.

The semiconductor pillar MH includes, for example, a block insulation film 33, an insulation film 34, a tunnel oxide film 35, and a conductive semiconductor material 36. More specifically, the block insulation film 33 is formed on the inner wall of a memory hole that forms the semiconductor pillar MH. The insulation film 34 is formed on the inner wall of the block insulation film 33. The tunnel oxide film 35 is formed on the inner wall of the insulation film 34. The conductive semiconductor material 36 is formed or, for example, buried inside the tunnel oxide film 35. The semiconductor material 36 may contain a different material.

In such a structure of the semiconductor pillar MH, the insulation film 34 functions as a charge accumulation layer for the memory cell transistors MTs, and a channel for the NAND string NS is formed in the semiconductor material 36. Then, the intersection between the semiconductor pillar MH and the conductor 22 functions as the select transistor ST2. The intersections between the semiconductor pillar MH and the conductors 23 to 30 function as the memory cell transistors MT0 to MT7, respectively. The intersection between the semiconductor pillar MH and the conductor 31 functions as the select transistor ST1.

Referring back to FIG. 6, descriptions will be given of one example of the configurations for connecting the bit lines BLs and the word lines WLs of the memory chip 1-1 to the sense amplifiers 12 and the row decoders 11 of the circuit chip 1-2.

One bit line BL will be focused on. A conductive contact plug 37 is provided at the bottom face of the conductor 32 that functions as the bit line BL. A conductor 38 is provided at the bottom face of the contact plug 37. A joint metal 39 is provided at the bottom face of the conductor 38. As the joint metal 39, copper may be adopted, for example.

With such a configuration, one joint metal 39 is electrically connected to one bit line BL. The same configuration may be adopted for the other bit lines BLs, which are thus each connected to a different group of a contact plug 37, a conductor 38, and a joint metal 39 in the region not shown in the figure.

In the hookup area 14, a plurality of conductors 40 are provided below the conductor 21 in the number corresponding to, for example, the number of the contact plugs CCs. For example, the contact plug CC is provided at the bottom face of the conductor 25 corresponding to the word line WL2, and the conductor 40 corresponding to the word line WL2 is provided at the bottom face of this contact plug CC. In a similar manner, the contact plugs CCs corresponding to the respective lines are formed to be electrically connected to the corresponding ones of the stacked conductors 22 to 31, while being insulated from the other conductors.

Focusing on the conductor 40 corresponding to the word line WL2, a contact plug 41 is provided at the bottom face of the conductor 40. A conductor 42 is provided at the bottom face of the contact plug 41. A joint metal 43 is provided at the bottom face of the conductor 42. As the joint metal 43, copper may be adopted, for example.

With such a configuration, one joint metal 43 is electrically connected to one word line WL. The same configuration may be adopted for the conductors 40 corresponding to the other word lines WLs and the select gate lines SGS and SGD. They are thus each connected to a different group of a contact plug 41, a conductor 42, and a joint metal 43 in the region not shown in the figure.

Next, the detailed structure of the circuit chip 1-2 will be described. In the circuit chip 1-2, the sense amplifier 12 is provided below the region of the memory cell array 10, and the row decoder 11 is provided below the hookup area 14.

In the region of the sense amplifier 12, for example, a conductor 51 is provided on a semiconductor substrate 50 via an insulation film. This conductor 51 functions as a gate electrode, and therefore, a structure of a metal-oxide-semiconductor field effect transistor (MOSFET) including source/drain regions, etc. is formed. The source and drain regions of this transistor are connected to respective conductors 53 via respective contact plugs 52. A joint metal 54 is provided on one of the conductors 53. As the joint metal 54, copper may be adopted, for example.

One joint metal 39 is connected onto the joint metal 54. That is, one bit line BL in the memory chip 1-1 is connected to the corresponding transistor in the sense amplifier 12 via the joint metals 39 and 54. The sense amplifier 12 includes a plurality of transistors in the region not shown in the figure, and these transistors are each electrically connected to a different bit line BL via a different group of a conductor 53 and a joint metal 54.

In the region of the row decoder 11, for example, a conductor 55 is provided on the semiconductor substrate 50 via an insulation film. This conductor 55 functions as a gate electrode, and therefore, a MOSFET structure including source/drain regions, etc. is formed. The source and drain regions of this transistor are connected to respective conductors 57 via respective contact plugs 56. A joint metal 58 is provided on one of the conductors 57. As the joint metal 58, copper may be adopted, for example.

One joint metal 43 is connected onto the joint metal 58. That is, for example, one word line WL in the memory chip 1-1 is connected to the corresponding transistor in the row decoder 11 via the joint metals 43 and 58. The row decoder 11 includes a plurality of transistors in the region not shown in the figure, and these transistors are each electrically connected to a different word line WL or select gate line SGS or SGD via a different group of a conductor 57 and a joint metal 58.

Figure 8:
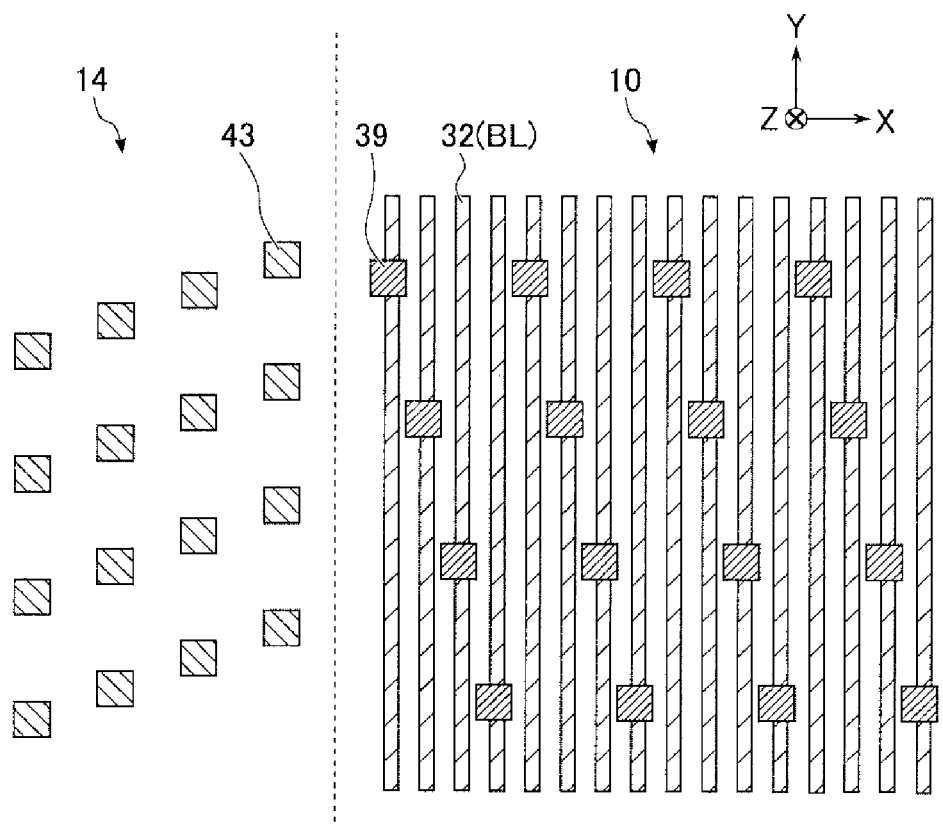
FIG. 8 shows one example of the detailed planar layout of the memory cell array and the hookup area in the semiconductor memory according to the first embodiment.

FIG. 8 shows one example of a more detailed planar layout of the joint metals 39 and 43 described above. As shown in FIG. 8, in the region of the memory cell array 10, different joint metals 39 are disposed on the arrayed bit lines BLs, respectively. In the hookup area 14, the joint metals 43 are disposed with substantially equal intervals in the Y direction, and the similarly disposed joint metals 43 are arrayed in the X direction with gradual displacement in the Y direction.

The joint metals 54 and 58 in the circuit chip 1-2 are similarly disposed so that the corresponding joint metals contact each other when the memory chip 1-1 and the circuit chip 1-2 are bonded together. Note that the layout for the joint metals 39 and 43 is not limited to this, and other layouts may be applied as well.

Figure 9:
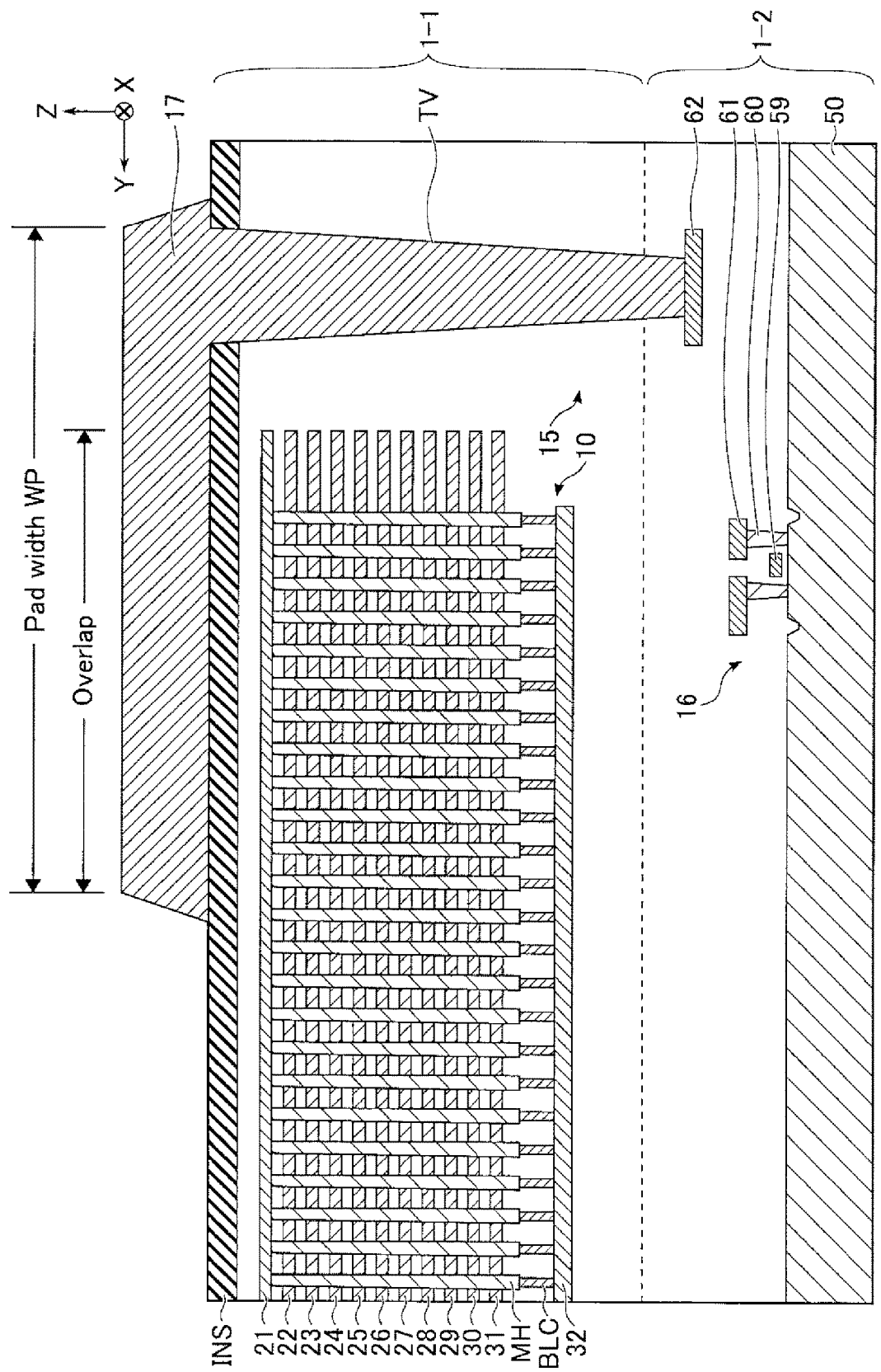
FIG. 9 shows one example of the sectional configuration of the memory cell array and a pad area in the semiconductor memory according to the first embodiment.

FIG. 9 shows one example of the Y direction-sectional structure of the memory cell array 10 and the pad area 15 in the semiconductor memory 1 according to the first embodiment. As shown in FIG. 9, the peripheral circuit 16 is provided near the pad area 15 and below the memory cell array 10.

In the region of the peripheral circuit 16, for example, a conductor 59 is provided on the semiconductor substrate 50 via an insulation film. This conductor 59 functions as a gate electrode, and therefore, a MOSFET structure including source/drain regions, etc. is formed. The source and drain regions of this transistor are connected to respective conductors 61 via respective contact plugs 60.

In the pad area 15 of the circuit chip 1-2, a conductor 62 is provided above the semiconductor substrate 50. The conductor 62 is electrically connected to the peripheral circuit 16. More specifically, the conductor 62 is included in the input/output circuit in the peripheral circuit 16. As the conductor 62, copper, aluminum, etc. may be adopted, for example. A contact via TV is opened from the top face of the conductor 62 to an insulation film INS at the topmost face of the memory chip 1-1. A conductor is formed or, for example, buried inside the contact via TV. The contact via TV is designed as small as possible within the extent that a conductor can be formed or buried in this manner. The conductor formed in the contact via TV is insulated from the conductors 21 to 31 in the memory chip 1-1.

The conductor formed in the contact via TV includes a portion exposed on the memory chip 1-1, and this portion functions as one pad 17. The pad 17 includes a portion overlapping with the memory cell array 10 provided in the memory chip 1-1, as shown in FIG. 9. In other words, between the pad 17 and the semiconductor substrate 50, there are, for example, ends of the conductors functioning as the word lines WLs, and also a region of the semiconductor pillars MHs. In the following descriptions, the size of the pad 17 in the Y direction will be called a pad width WP.

Figure 10:
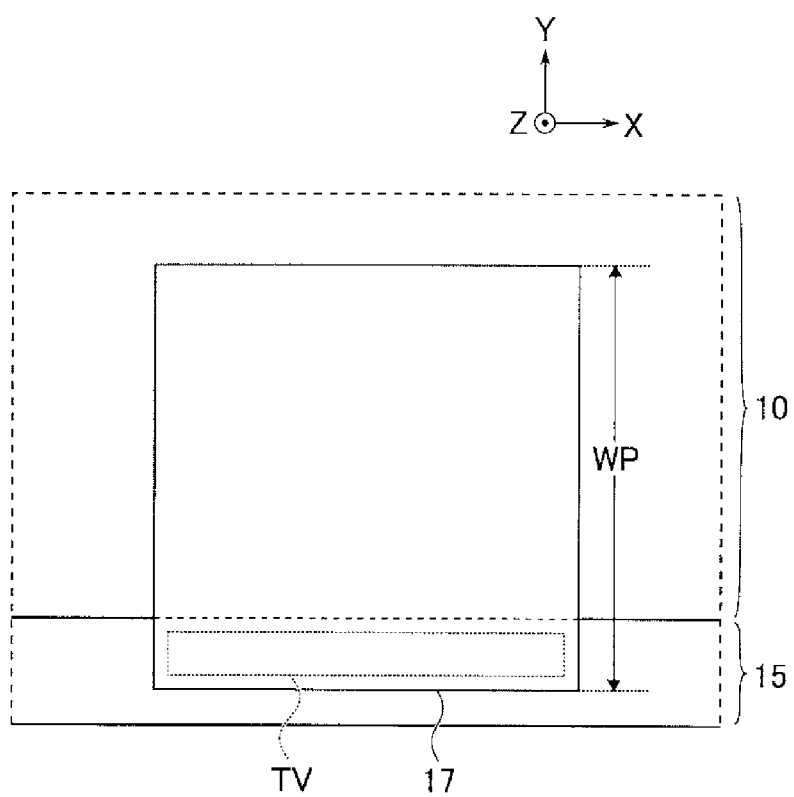
FIG. 10 shows a design example of a pad provided for the semiconductor memory according to the first embodiment.
Figure 11:
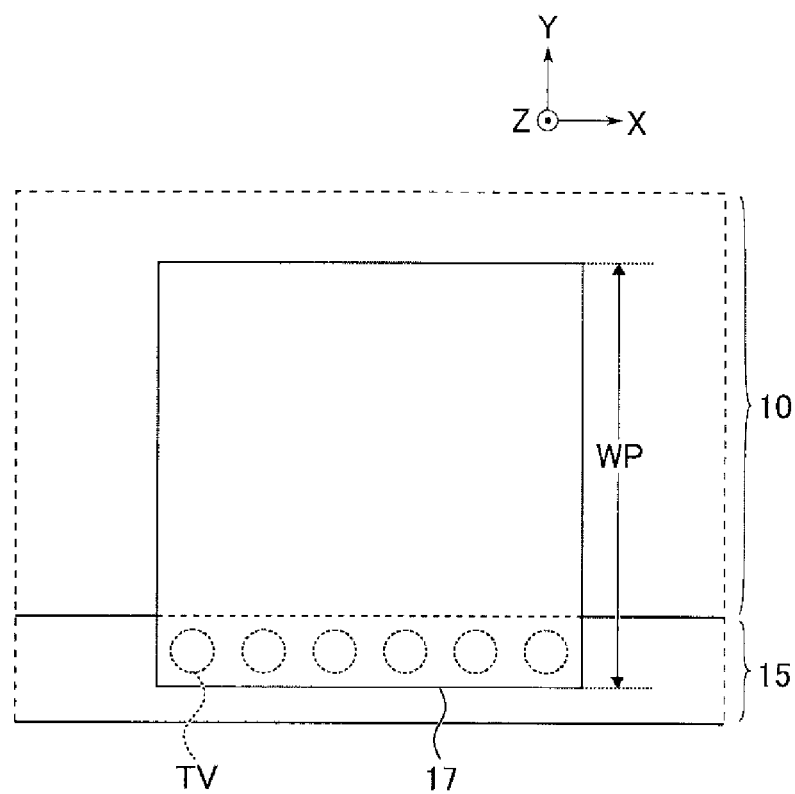
FIG. 11 shows a design example of the pad provided for the semiconductor memory according to the first embodiment.

FIGS. 10 and 11 show design examples of the pad 17 in the semiconductor memory 1 according to the first embodiment. Specifically, the figures illustrate examples of the shapes of the contact via TV. The contact via TV may be linearly provided as shown in FIG. 10, or may be provided as dots as shown in FIG. 11. Also, the multiple contact vias TVs may connect the pad 17 with the conductor 62 as shown in FIG. 11. The shape of the contact via TV corresponding to one pad 17 is not limited to these, but may be a combination of the linear shape and the dot shape, or may adopt other shapes.

Note that the structure of the semiconductor memory 1 according to the first embodiment is not limited to the structures described above. For example, the select gate lines SGS and SGD in the context of the above descriptions may be formed from a plurality of conductor layers, respectively. The number of the memory cell transistors MTs included in one NAND string NS is varied by changing the number of the conductors (corresponding to the word lines WLs) which one semiconductor pillar MH passes.

For example, one NAND string NS may have a structure in which the multiple semiconductor pillars MHs are coupled in the Z direction. The connection between the semiconductor pillar MH and the conductor 32, and the connection between the contact plug CC and the conductor 40 may be made via other contact plugs or different conductors. The connection between the joint metal 39 and the conductor 32, the connection between the joint metal 43 and the conductor 40, the connection between the joint metal 54 and the conductor 53, and the connection between the joint metal 58 and the conductor 57 may be made via other contact plugs or different conductors.

1-2 Production Method

Hereinafter, a series of steps after forming each of the memory chip 1-1 and the circuit chip 1-2 up to forming the pad 17 in the semiconductor memory 1 according to the first embodiment will be described with reference to FIGS. 12 to 15.

Figure 12:
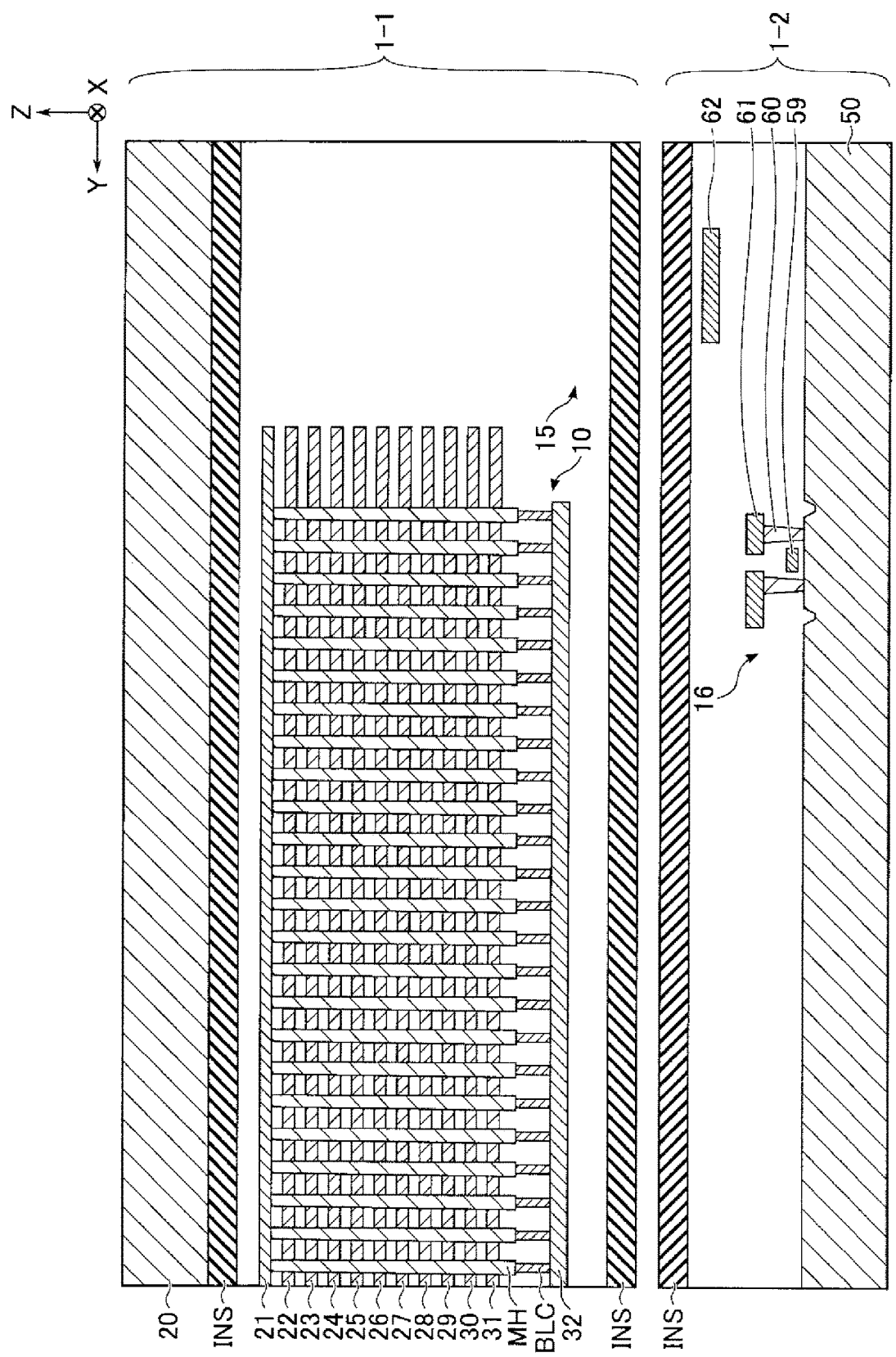
FIG. 12 shows one example of the production step of the semiconductor memory according to the first embodiment.

FIG. 12 shows a state where the memory chip 1-1 and the circuit chip 1-2 have been formed on different wafers before they are bonded together. Specifically, the memory chip 1-1 is formed on a semiconductor substrate 20, and the circuit chip 1-2 is formed on the semiconductor substrate 50. In the figure, the memory chip 1-1 is turned around to face the circuit chip 1-2, with the memory cell array 10 positioned below the semiconductor substrate 20.

FIG. 12 also shows an insulation film INS at the lowermost layer and an insulation film INS at the uppermost layer in the memory chip 1-1 formed on the semiconductor substrate 20. An insulation film INS is shown at the uppermost layer of the circuit chip 1-2 formed on the semiconductor substrate 50.

Figure 13:
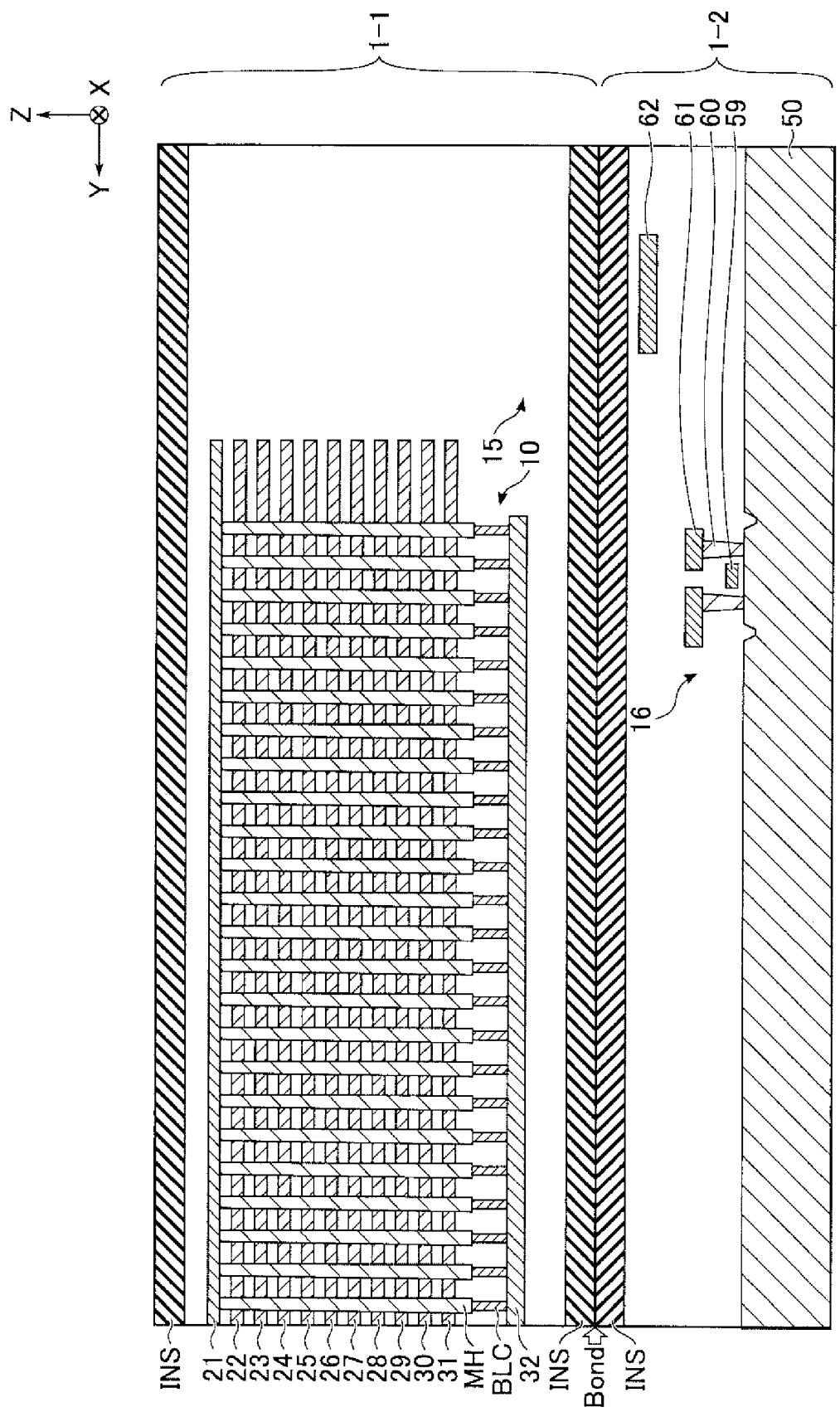
FIG. 13 shows one example of the production step of the semiconductor memory according to the first embodiment.

The memory chip 1-1 and the circuit chip 1-2 are attached to each other as shown in FIG. 13. Specifically, the semiconductor substrate 20 and the semiconductor substrate 50 are arranged to face each other so that various circuits formed thereon are sandwiched, and mechanical pressure is applied to them for wafer-to-wafer bonding. At this time, the corresponding joint metals are joined together in the regions not shown.

More specifically, the corresponding joint metals 39 and 54 are joined together, and the corresponding joint metals 43 and 58 are joined together. After bonding the memory chip 1-1 and the circuit chip 1-2, the semiconductor substrate 20 of the memory chip 1-1 is removed. The insulation film INS is left on the face after removing the semiconductor substrate 20, and serves as a passivation film for protecting the surface of the memory chip 1-1.

Figure 14:
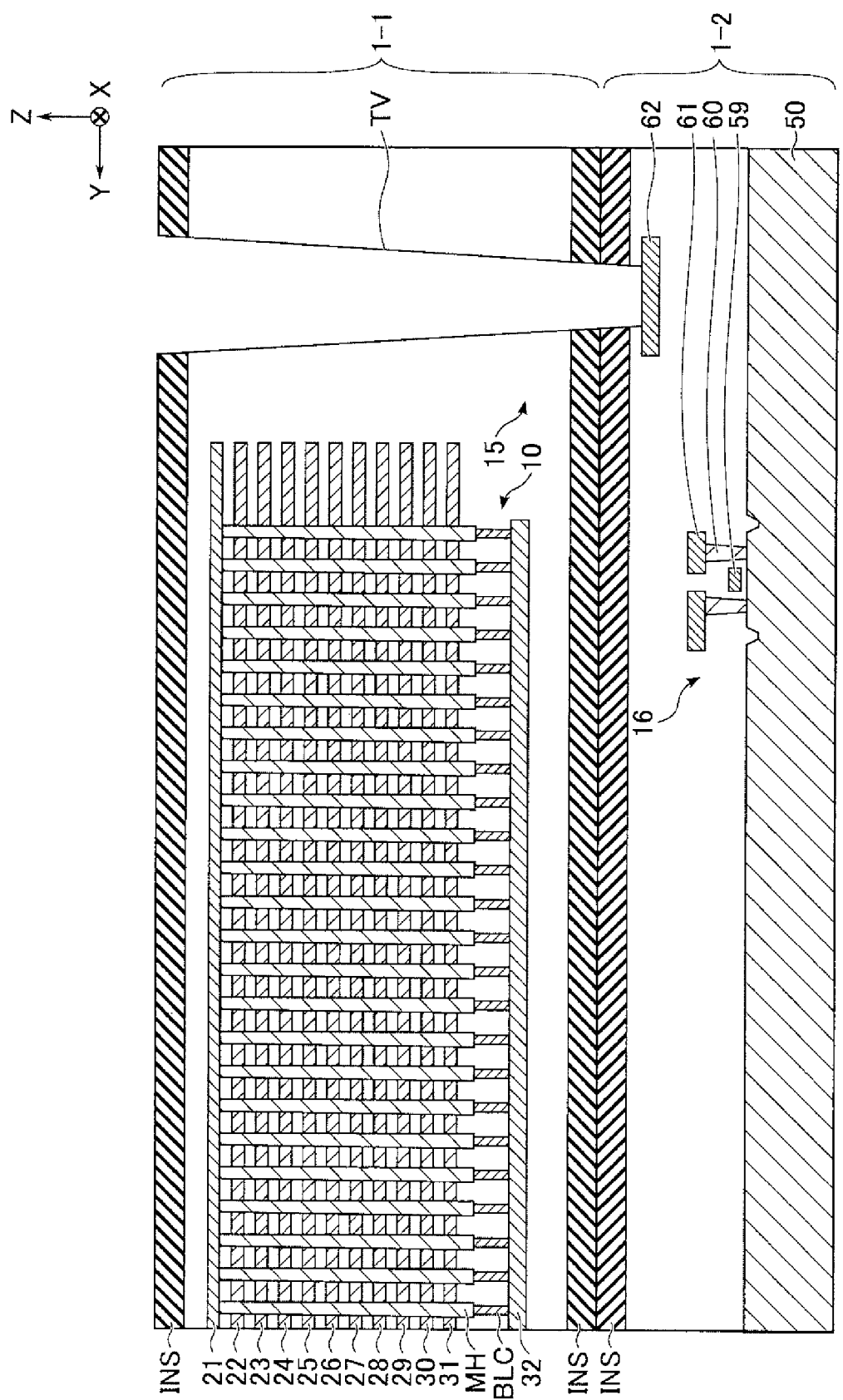
FIG. 14 shows one example of the production step of the semiconductor memory according to the first embodiment.
Figure 15:
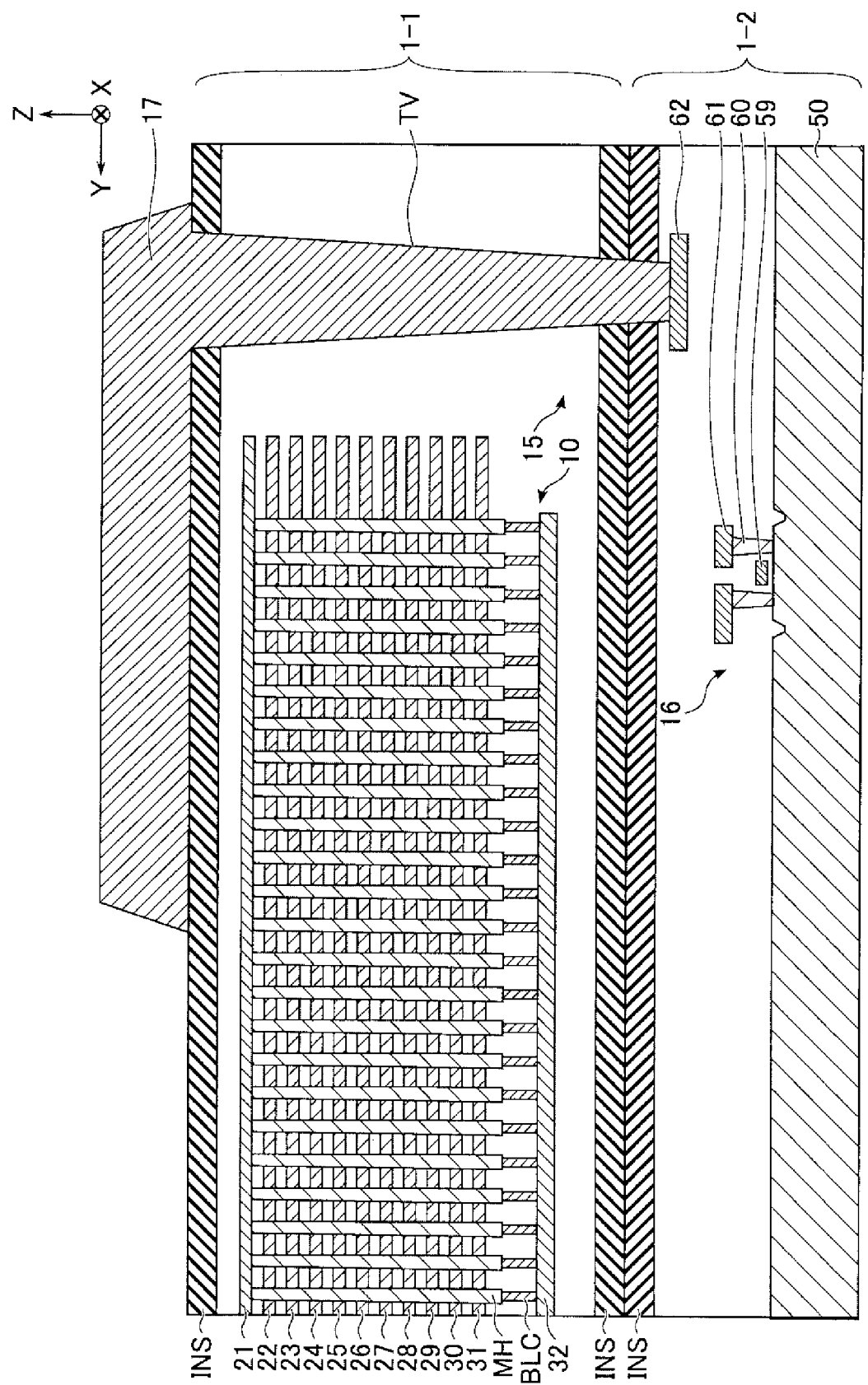
FIG. 15 shows one example of the production step of the semiconductor memory according to the first embodiment.

Then, as shown in FIG. 14, the contact via TV is formed from the face of the memory chip 1-1, from which the semiconductor substrate 20 has been removed, up to the conductor 62. Metal is formed or, for example, buried in the formed contact via TV. The deposited metal on the memory chip 1-1 is processed into a desired shape as shown in FIG. 15. In this manner, the pad 17 having an intended shape is formed.

1-3 Effects of First Embodiment

The semiconductor memory 1 according to the first embodiment described above can reduce the chip area associated with it. The specific effects of the semiconductor memory 1 according to the first embodiment will be described.

In order to reduce the bit cost of a semiconductor memory, it is desirable to increase the ratio of area of a memory cell array (cell occupancy) in the chip area of the semiconductor memory. As a method for increasing the cell occupancy in a semiconductor memory, it has been known to form a memory cell array and a peripheral circuit on different wafers, and bond these wafers together into one semiconductor chip.

Figure 17:
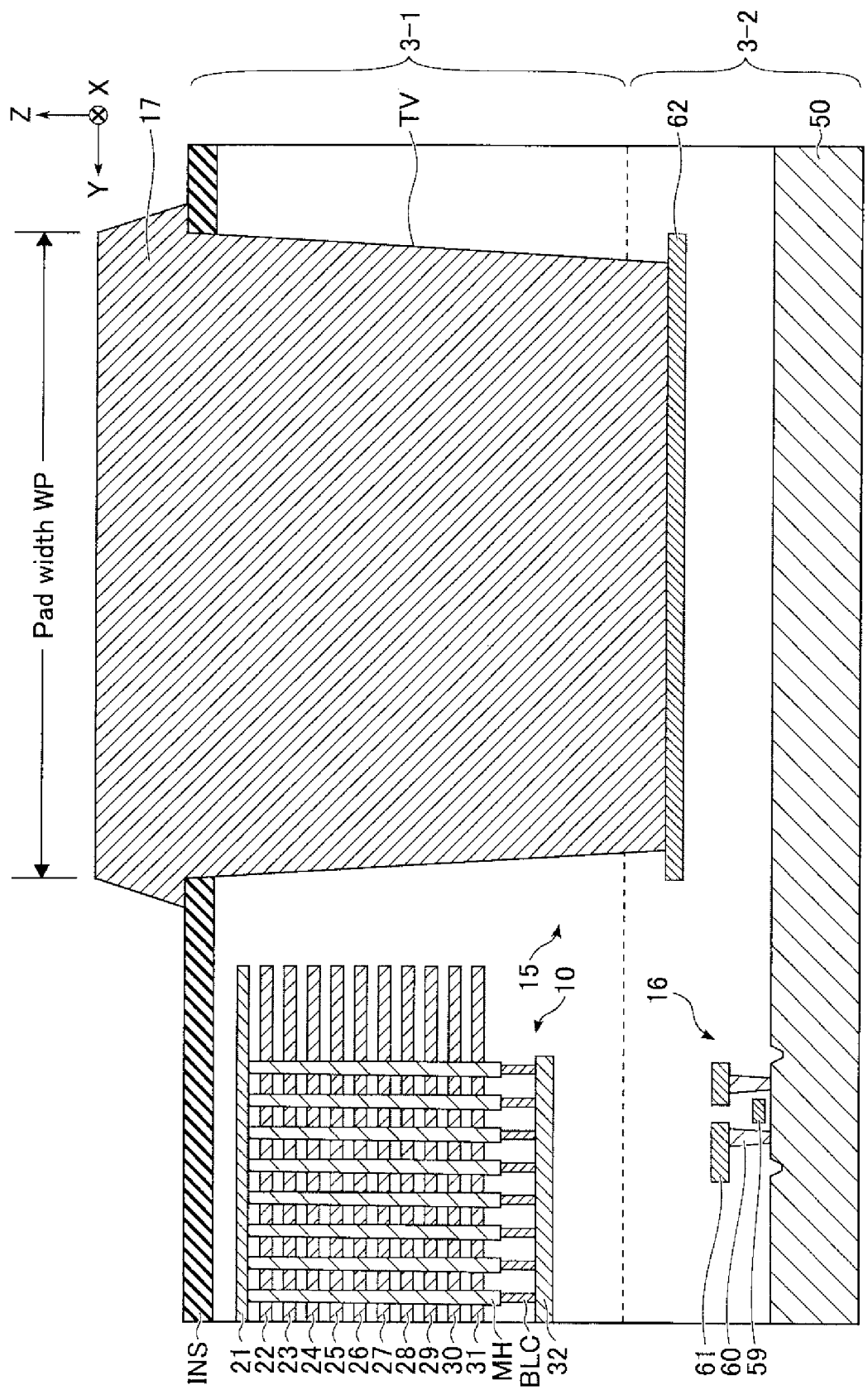
FIG. 17 shows one example of the sectional configuration of a memory cell array and a pad area in the semiconductor memory according to the comparative example of the first embodiment.

With the structure of a semiconductor memory in which a wafer having a memory cell array and a wafer having a peripheral circuit are bonded together, the memory cell array and the peripheral circuit overlap with each other on the semiconductor chip, and therefore, the cell occupancy can be increased. FIGS. 16 and 17 show one example of the semiconductor memory having such a structure. FIGS. 16 and 17 show the planar layout and the sectional structure of a semiconductor memory 3 according to a comparative example of the first embodiment, respectively.

The semiconductor memory 3 according to the comparative example differs from the semiconductor memory 1 according to the first embodiment in the design of the pads 17. As shown in FIG. 16, in the semiconductor memory 3 according to the comparative example, the size of the pad area 15 is designed based on the pad width WP of the pads 17, so that the pads 17 are entirely disposed within the pad area 15.

Also, as shown in FIG. 17, the semiconductor memory 3 according to the comparative example has a structure in which a memory chip 3-1 and a circuit chip 3-2 are bonded together, and the semiconductor memory 3 is designed so that the stacked lines constituting the memory cell array 10 are not included under the pad 17. The area of the pad 17 is determined based on the bonding step in the latter processes for the semiconductor memory 3, and therefore, difficult to be reduced. Moreover, for the semiconductor memory 3 according to the comparative example, the pad area 15 is designed to be wide based on the area of the pad 17, which results in decrease of the cell occupancy.

In contrast, the semiconductor memory 1 according to the first embodiment includes the region where the pad 17 overlaps with the memory cell array 10 as shown in FIGS. 4 and 9. With this structure, the semiconductor memory 1 according to the first embodiment can reduce the size of the pad area 15 as compared to the semiconductor memory 3 according to the comparative example. Therefore, the semiconductor memory 1 according to the first embodiment can increase the cell occupancy and suppress the bit cost associated with it.

Also, for the semiconductor memory 1 according to the first embodiment, the memory chip 1-1 and the circuit chip 1-2 are formed using different wafers so that the thermal processes to form the memory chip 1-1 and the thermal processes to form the circuit chip 1-2 are controlled independently of each other. This can diminish the thermal load on the circuit chip 1-2 due to the thermal processes for forming the memory chip 1-1, and therefore, can permit adoption of low-resistance lines, such as copper lines, as supply lines and various lines in the circuit chip 1-2. Accordingly, the semiconductor memory 1 according to the first embodiment can improve the device performance.

Furthermore, for the semiconductor memory 1 according to the first embodiment, the memory chip 1-1 and the circuit chip 1-2 are bonded together to connect the memory cell arrays 10 and the peripheral circuits such as the sense amplifiers 12. In other words, the semiconductor memory 1 according to the first embodiment allows omission of the deep-hole processing for making connections from the memory cell arrays 10 to the circuits on the semiconductor substrate 50. Accordingly, the semiconductor memory 1 according to the first embodiment can reduce the production costs.

2 Second Embodiment

A semiconductor memory 1 according to the second embodiment differs from the semiconductor memory 1 according to the first embodiment in layout of the pad 17. For the semiconductor memory 1 according to the second embodiment, the differences from the semiconductor memory 1 according to the first embodiment will be described.

2-1 Configurations

Figure 18:
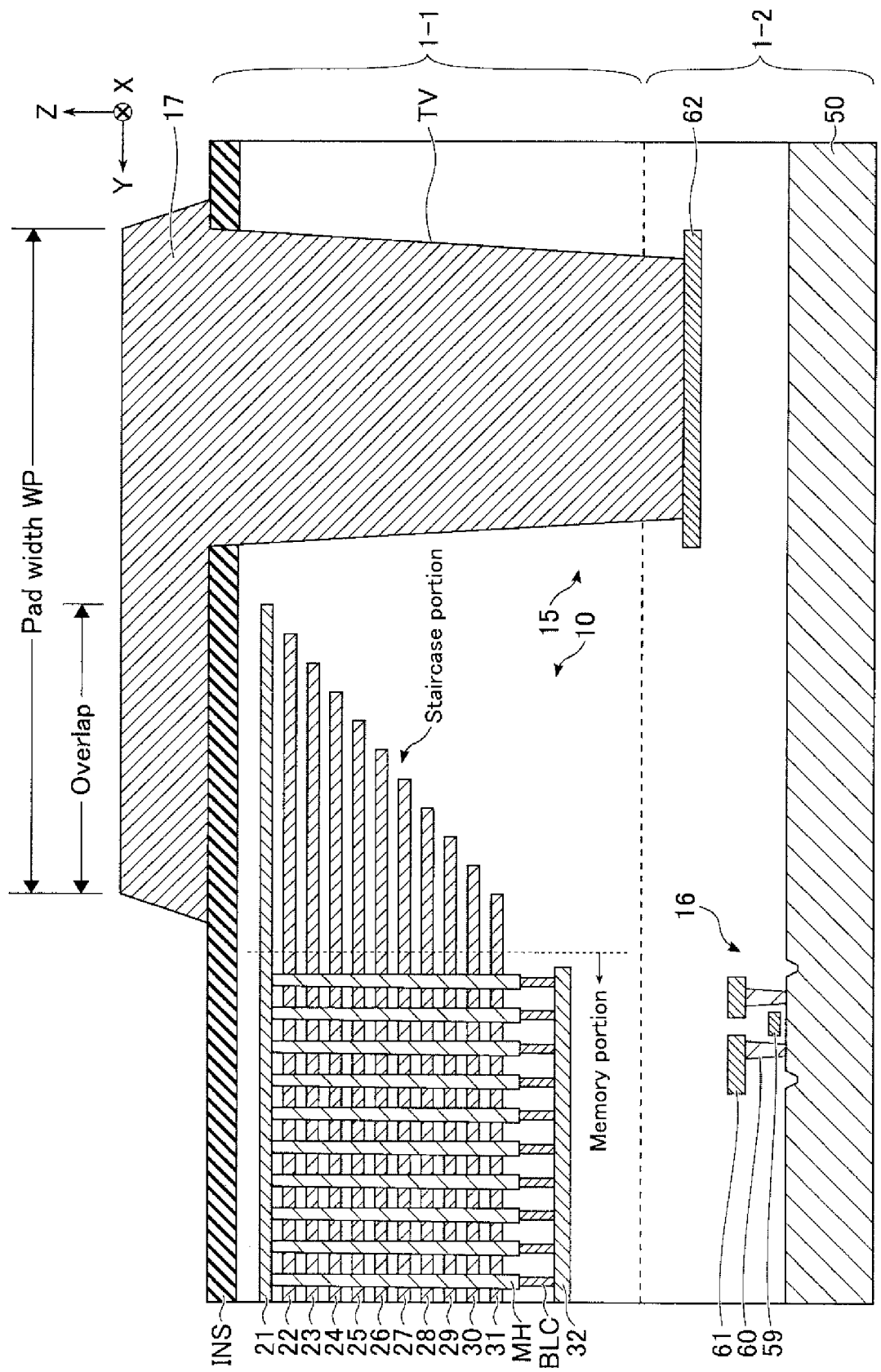
FIG. 18 shows one example of the sectional configuration of a memory cell array and a pad area in a semiconductor memory according to a second embodiment.

FIG. 18 shows one example of the Y direction-sectional structure of the memory cell array 10 and the pad area 15 in the semiconductor memory 1 according to the second embodiment. As shown in FIG. 18, the sectional structure of the semiconductor memory 1 according to the second embodiment differs from the sectional structure of the semiconductor memory 1 described for the first embodiment with reference to FIG. 9, in the structure of the memory cell array 10 in the region overlapping with the pad 17.

Specifically, in the semiconductor memory 1 according to the second embodiment, a staircase portion of a structure similar to the hookup area 14 is formed in the region of the outer periphery of the memory cell array 10 where the hookup area 14 is not adjacent. In this region, more specifically, the ends of the conductors 23 to 30 each functioning as, for example, a word line WL, are arranged in a stepwise manner. The width of this staircase portion is formed smaller than, for example, that in the hookup area 14. Also, no conductors to connect the memory chip 1-1 with the circuit chip 1-2 are connected in this staircase portion.

In the semiconductor memory 1 according to the second embodiment, the pad 17 is provided to overlap with this staircase portion of the memory cell array 10 but not to overlap with the memory portion of the memory cell array 10 where the semiconductor pillars MHs are disposed. In terms of other configurations, the semiconductor memory 1 according to the second embodiment is the same as the semiconductor memory 1 according to the first embodiment. Thus, descriptions of these configurations will be omitted.

2-2 Effects of Second Embodiment

In the bonding step among the latter processes for the semiconductor memory 1, a pressure is applied from above the pad 17 toward the semiconductor substrate 50. In the semiconductor memory 1 according to the second embodiment, the staircase portion that does not involve the semiconductor pillars MHs, etc. is arranged between the semiconductor substrate 50 and the pad 17.

That is, for the semiconductor memory 1 according to the second embodiment, the pressure applied to the pad 17 is conveyed to the staircase portion not including a valid device, at the time of bonding in the latter processes. As such, the semiconductor memory 1 according to the second embodiment can avoid the pressure applied on the semiconductor pillars MHs during the bonding in the latter processes.

The semiconductor memory 1 according to the second embodiment can thus suppress the occurrence of deficiencies due to the bonding in the latter processes. Accordingly, the semiconductor memory 1 according to the second embodiment can improve the yields associated with it.

Furthermore, the semiconductor memory 1 according to the second embodiment can reduce the size of the pad area 15 by as much as it overlaps with the staircase portion. Therefore, the semiconductor memory 1 according to the second embodiment can increase the cell occupancy and suppress the bit cost associated with it.

3 Third Embodiment

A semiconductor memory 1 according to the third embodiment further adds a structure having a plurality of coupled memory chips to the semiconductor memory 1 according to the first embodiment. For the semiconductor memory 1 according to the third embodiment, the differences from the semiconductor memory 1 according to the first and the second embodiments will be described.

3-1 Configurations

The semiconductor memory 1 according to the third embodiment includes the memory chip 1-1 and the circuit chip 1-2 as described for the first embodiment, and further includes a memory chip 1-3. The memory chip 1-3 has a configuration similar to the memory chip 1-1. The memory chip 1-1 and the memory chip 1-3 are formed using different wafers. The semiconductor memory 1 according to the third embodiment has a structure in which the memory chip 1-1 is attached onto the circuit chip 1-2 and the memory chip 1-3 is attached onto the memory chip 1-1.

FIG. 19 shows one example of the detailed planar layout of the memory cell array 10 and the hookup area 14 in the semiconductor memory 1 according to the third embodiment. The figure specifically shows four string units SU0 to SU3 arrayed in the Y direction.

As shown in FIG. 19, the planar layout of the semiconductor memory 1 according to the third embodiment differs from the planar layout of the semiconductor memory 1 according to the first embodiment, described with reference to FIG. 5, in structure of the region of the memory cell array 10.

Specifically, each string unit SU is provided with a plurality of coupling areas CAs in the region of the memory cell array 10. The coupling area CA is an area for forming lines to electrically connect the bit lines BLs of the memory chip 1-1 and the bit lines BLs of the memory chip 1-3. The coupling areas CAs provided in each string unit SU are arranged in, for example, the Y direction. This is, however, not a limitation. The coupling areas CAs may be designed to cover any given ranges and positions.

FIG. 20 shows a more detailed planar layout of the region of the memory cell array 10, including the coupling areas CAs. As shown in FIG. 20, the coupling area CA is provided with a plurality of contact vias CVs. The contact vias CVs are arranged in, for example, the Y direction. An insulation film 44 is formed on the inner wall of the contact via CV. A conductor 45 is formed or, for example, buried in the portion of the contact via CV that is more inside than the insulation film 44. The conductors 45 are connected to the respective conductors 38 connected to different bit lines BLs.

Figure 21:
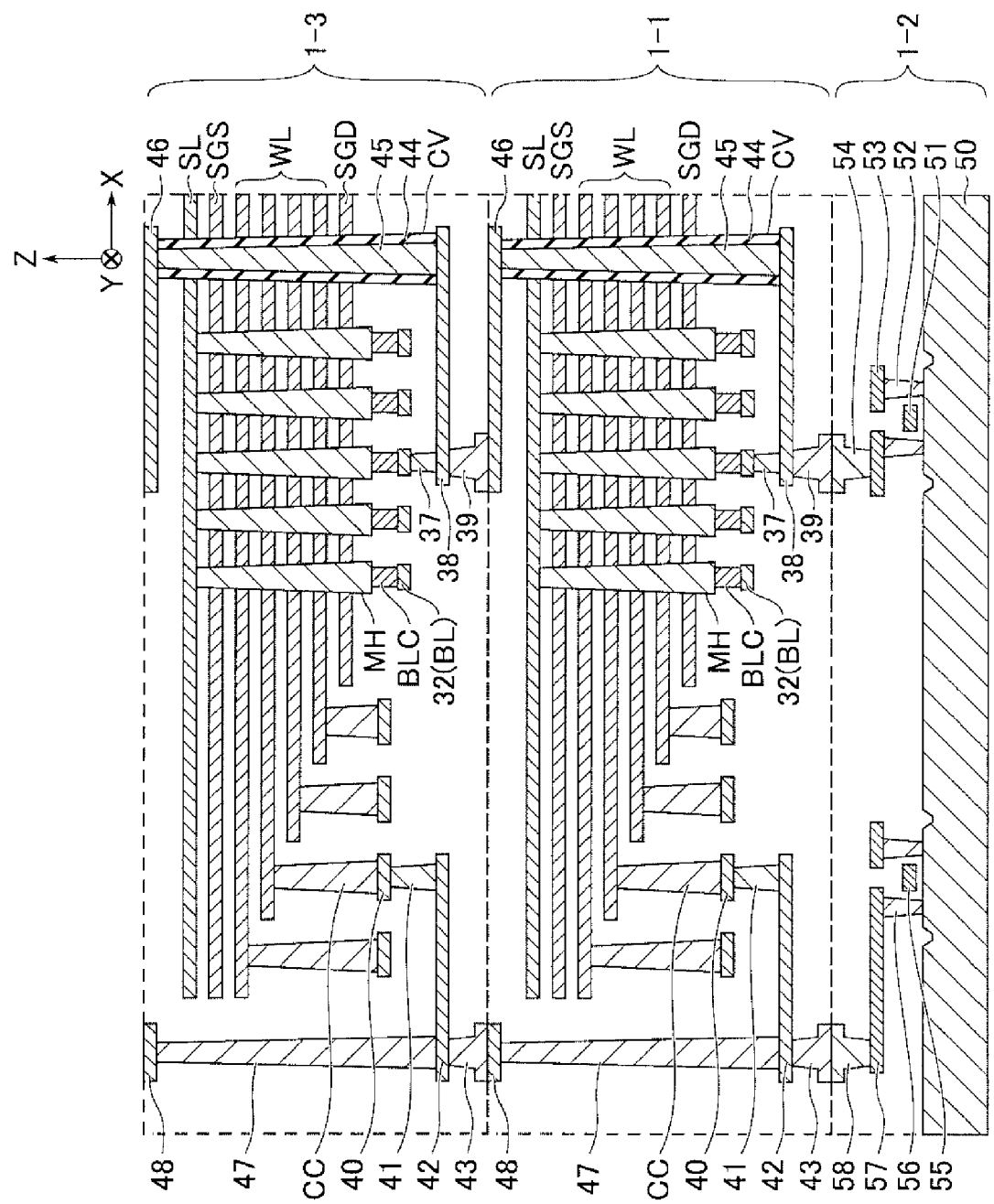
FIG. 21 shows one example of the sectional configuration of the memory cell array and the hookup area in the semiconductor memory according to the third embodiment.

FIG. 21 shows one example of the X direction-sectional structure of the memory cell array 10 and the hookup area 14 in the semiconductor memory 1 according to the third embodiment. Note that the figures that will be used in the following descriptions omit part of the conductors corresponding to the word lines WLs, as appropriate for descriptive purposes. As shown in FIG. 21, in the semiconductor memory 1 according to the third embodiment, the memory chip 1-1 is provided on the circuit chip 1-2, and the memory chip 1-3 is provided on the memory chip 1-1.

In the memory chip 1-1, the contact via CV is provided on the top face of the conductor 38 connected between one bit line BL and the joint metal 39. The conductor 45 in the contact via CV is insulated from the stacked line structure, such as the word lines WLs, by the insulation film 44. A conductor 46 is provided on the top face of the conductor 45. The conductor 46 is arranged to overlap with the joint metal 39 on the X-Y plane. The joint metal 39 is electrically connected to this conductor 46.

With such a structure, the conductor 46 provided in the memory chip 1-1 contacts the joint metal 39 provided in the memory chip 1-3 so that one bit line BL in the memory chip 1-1 and one bit line BL in the memory chip 1-3 are electrically connected with each other. In a similar manner, the other bit lines BLs in the memory chip 1-1 are connected to the respective corresponding bit lines BLs in the memory chip 1-3, via the conductors 45 in the respective corresponding contact vias CVs.

Similar to the bit lines BLs, the word lines WLs in the memory chip 1-1 have a structure for electrically connecting the lines corresponding to a common address, between the memory chips 1-1 and 1-3. More specifically, a further contact plug 47 is provided on the top face of the conductor 42 connected between one word line WL and the joint metal 43. The contact plug 47 is connected to a conductor 48 provided in the same layer as the conductor 46. The conductor 48 is arranged to overlap with the joint metal 43 on the X-Y plane. The joint metal 43 is electrically connected to this conductor 48.

With such a structure, the conductor 48 provided in the memory chip 1-1 contacts the joint metal 43 provided in the memory chip 1-3 so that one word line WL in the memory chip 1-1 and one word line WL in the memory chip 1-3 are electrically connected with each other. In a similar manner, the other word lines WLs and the select gate lines SGS and SGD in the memory chip 1-1 are connected to the respective corresponding lines in the memory chip 1-3, via the respective corresponding contact plugs 47.

FIG. 22 shows one example of the Y direction-sectional structure of the memory cell array 10 and the pad area 15 in the semiconductor memory 1 according to the third embodiment. As shown in FIG. 22, in the semiconductor memory 1 according to the third embodiment, the contact via TV penetrates through each of the memory chips 1-1 and 1-3.

More specifically, the contact via TV is opened from the top face of the conductor 62 in the circuit chip 1-2 to an insulation film INS at the topmost face of the memory chip 1-3. A conductor is formed or, for example, buried in the contact via TV. The contact via TV is formed as small as possible within the extent that a conductor may be formed or buried in this manner. The conductor formed in the contact via TV is insulated from the word lines WLs and the select gate lines SGS and SGD in each of the memory chips 1-1 and 1-3.

The conductor formed in the contact via TV includes a portion exposed on the memory chip 1-3, and this portion exposed on the memory chip 1-3 functions as one pad 17. As in the first embodiment, the pad 17 includes a portion overlapping with the memory cell arrays 10 in the memory chips 1-1 and 1-3.

In the semiconductor memory 1 according to the third embodiment, the distance from the source line SL in the memory chip 1-3 to the top face of the memory chip 1-3 is larger than the distance from the source line SL in the memory chip 1-1 to the memory chip 1-3. This is because, in the memory chip stacked as an uppermost layer, a thick insulation film INS is retained so that the conductors 46 and 48 for connecting the stacked memory chips are not exposed.

In the semiconductor memory 1 according to the third embodiment described above, the address of the word lines WLs having a common connection between the memory chips 1-1 and 1-3 are designated by the same address information ADD (e.g., page address), and the address of the bit lines BLs having a common connection between the memory chips 1-1 and 1-3 are designated by the same address information ADD (e.g., column address).

In the semiconductor memory 1 according to the third embodiment, information for designating the memory chip which is included in, for example, the address information ADD is referred to in order to select one of the memory chips 1-1 and 1-3. This enables the semiconductor memory 1 according to the third embodiment to select one of the word lines WLs having the same address in the memory chips 1-1 and 1-3, and to select one of the bit lines BLs having the same address in the memory chips 1-1 and 1-3. In terms of other configurations, the semiconductor memory 1 according to the third embodiment is the same as the semiconductor memory 1 according to the first embodiment. Thus, descriptions of these configurations will be omitted.

3-2 Effects of Third Embodiment

As described above, the semiconductor memory 1 according to the third embodiment has a structure in which the memory chips 1-1 and 1-3 are stacked on the circuit chip 1-2. Also, in the semiconductor memory 1 according to the third embodiment, the pad 17 is provided to overlap over the memory cell array 10, as in the first embodiment.

This allows the semiconductor memory 1 according to the third embodiment to make the region to dispose the pad 17 smaller, as in the first embodiment. Therefore, the semiconductor memory 1 according to the third embodiment can increase the cell occupancy and suppress the bit cost associated with it.

The foregoing descriptions have assumed an instance where two memory chips 1-1 and 1-3 are stacked on the circuit chip 1-2 in the semiconductor memory 1. However, this is not a limitation. For example, there may be three or more memory chips stacked on the circuit chip 1-2 in the semiconductor memory 1. The number of the stacked memory chips may be discretionarily set. Even in such cases, it is possible to increase the cell occupancy in the semiconductor memory 1 by having the pads 17 overlapping over the memory cell arrays 10.

4 Fourth Embodiment

A semiconductor memory 1 according to the fourth embodiment further adds wirings different from the pad 17 to the tip surface of the semiconductor memory 1 according to the first embodiment. For the semiconductor memory 1 according to the fourth embodiment, the differences from the semiconductor memory 1 according to the first to third embodiments will be described.

4-1 Configurations

Figure 23:
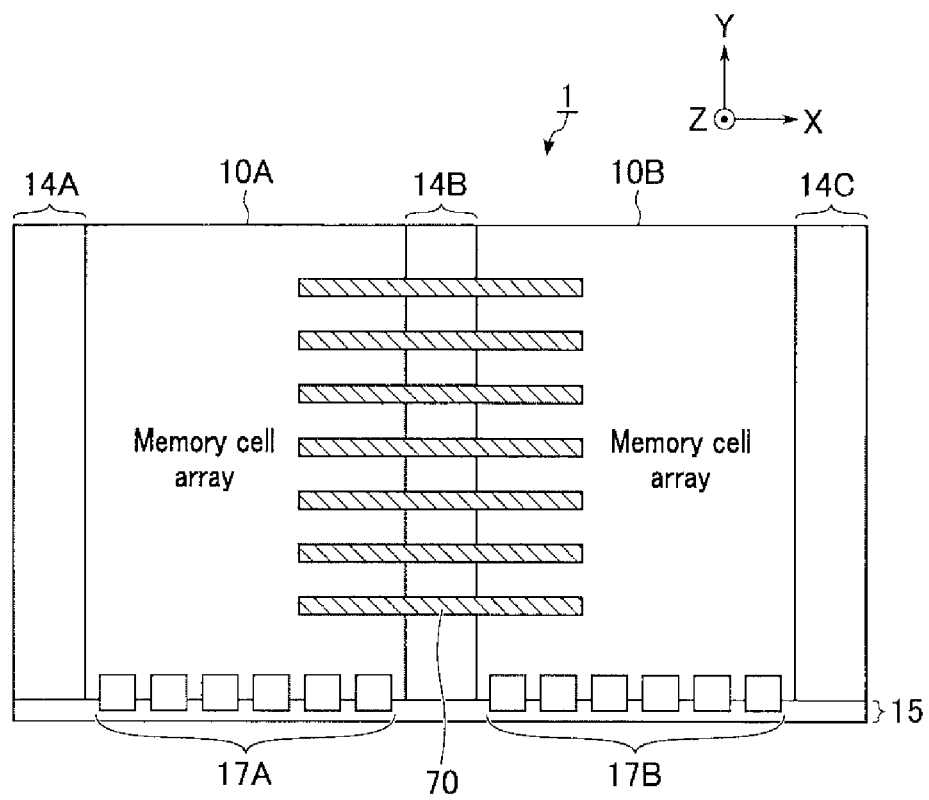
FIG. 23 shows one example of the planar layout of a semiconductor memory according to a fourth embodiment.

FIG. 23 shows the planar layout of the semiconductor memory 1 according to the fourth embodiment when the memory chip 1-1 and the circuit chip 1-2 have been bonded to each other. As shown in FIG. 23, the planar layout of the semiconductor memory 1 according to the fourth embodiment differs from the planar layout of the semiconductor memory 1 according to the first embodiment, described with reference to FIG. 4, in that a plurality of metal wirings 70 are added.

The metal wirings 70 extend in, for example, the X direction and bridge from the memory cell array 10A to the memory cell array 10B. As the metal wirings 70, aluminum may be adopted, for example. The metal wirings 70 are used as, for example, supply lines provided between the memory cell array 10A and the memory cell array 10B. The metal wirings 70 are not used for, for example, external connection of the semiconductor memory 1.

The shape and the number of the metal wirings 70 are not limited to the shape and the number shown in FIG. 23, but may be discretionarily set. Also, the metal wirings 70 may be provided in such a manner that they are all disposed on one memory cell array 10. Furthermore, the metal wirings 70 are not limited to the use mentioned above, but may be applied as other lines.

Figure 24:
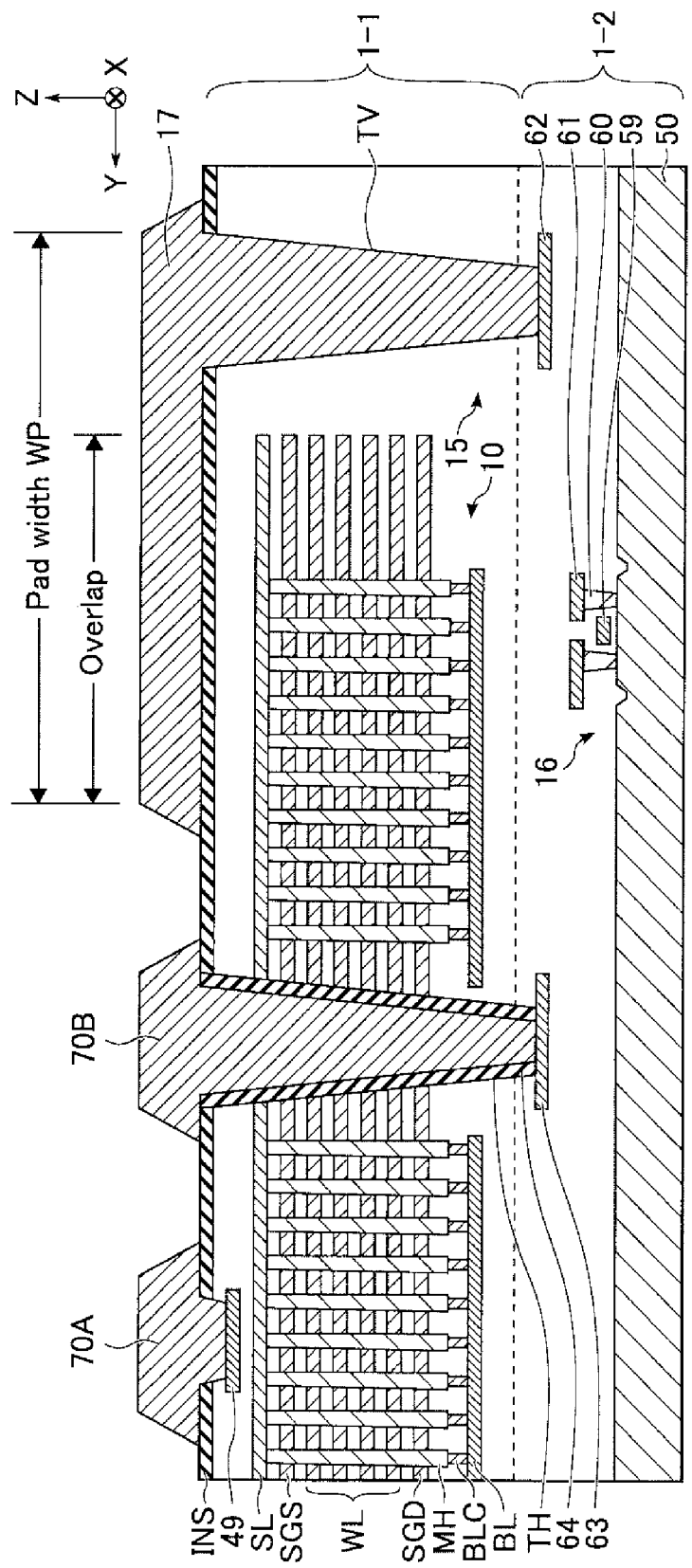
FIG. 24 shows one example of the sectional configuration of a memory cell array and a pad area in the semiconductor memory according to the fourth embodiment.

FIG. 24 shows one example of the Y direction-sectional structure of the memory cell array 10 and the pad area 15 in the semiconductor memory 1 according to the fourth embodiment. As shown in FIG. 24, the sectional structure of the semiconductor memory 1 according to the fourth embodiment differs from the sectional structure of the semiconductor memory 1 according to the first embodiment, described with reference to FIG. 9, in that the configurations relating to the metal wirings 70 are added. For this embodiment, the figure illustrates two metal wirings 70A and 70B.

The metal wiring 70A is connected to a conductor 49 provided within the memory chip 1-1. The conductor 49 is, for example, a line provided between the surface and the source line SL of the memory chip 1-1, and connected to the circuit within the memory chip 1-1.

The metal wiring 70B is connected to a conductor 63 provided within the circuit chip 1-2. The conductor 63 is connected to the circuit within the circuit chip 1-2. More specifically, a contact via TH is opened from the top face of the conductor 63 to the surface of the memory chip 1-1. This contact via TH passes the region of the memory cell array 10 where no semiconductor pillars MHs are provided.

An insulation film 64 is formed on the inner wall of the contact via TH, and a conductor functioning as the metal wiring 70B is formed or, for example, buried inside the insulation film 64. In this manner, the metal wiring 70B extends inside the memory cell array 10, and is insulated by the insulation film 64 from various lines such as the word lines WLs and the select gate lines SGS and SGD.

The metal wirings 70 described above are formed concurrently with, for example, the pad 17. For example, holes (the contact via TV and the contact via TH) for connecting the pad 17 and the metal wiring 70 to the respective circuits in the semiconductor memory 1 are formed first. Then, the conductors functioning as the pad 17 and the metal wiring 70 are formed or, for example, buried in the formed holes, respectively. The pad 17 and the metal wiring 70 are thereafter processed into desired shapes.

4-2 Effects of Fourth Embodiment

As described above, in the semiconductor memory 1 according to the fourth embodiment, the metal wirings 70 are provided in the same layer as the pad 17. The metal wirings 70 are used as, for example, low-resistance lines enabling connections between different memory cell arrays 10.

That is, with the semiconductor memory 1 according to the fourth embodiment, the resistance of the lines that connect the memory cell arrays 10 with each other can be reduced by adopting the metal wirings 70. Accordingly, the semiconductor memory 1 according to the fourth embodiment can improve the device performance.

5 Modification Examples, Etc

A semiconductor memory <FIG. 1, 1> according to the embodiments includes a first memory chip <FIG. 3, 1-1>, a circuit chip <FIG. 3, 1-2>, and an external connection electrode <FIG. 4, 17>. The first memory chip includes a plurality of first conductors <FIG. 7, 23 to 30> stacked via an insulator, and a first pillar <FIG. 7, MH> passing the first conductors and forming intersections with the first conductors. Each of the intersections functions as a memory cell. The circuit chip includes a substrate <FIG. 9, 50>, a control circuit <FIG. 9, 16> formed on the substrate, and a second conductor <FIG. 9, 62> connected to the control circuit. The circuit chip is attached to the first memory chip. The external connection electrode is provided on a surface of the first memory chip, and includes a portion extending from a side of the surface of the first memory chip through the first memory chip and connected to the second conductor. Part of the first conductors is included between the external connection electrode and the substrate. The semiconductor memory can thereby reduce the chip area.

Where possible, the embodiments can be combined. For example, the layout of the pad 17 described for the second embodiment can be applied to each of the third embodiment and the fourth embodiment. Also, the structure described for the third embodiment, in which a plurality of memory chips are stacked, can be applied to the fourth embodiment. In this way, by combining the embodiments as appropriate, the chip area of the semiconductor memory 1 can be reduced, while the performance of the semiconductor memory 1 can be improved.

In the above embodiments, one pad 17 has an area (dimension) larger than one joint metal 39, 43, 54, or 58. In other words, for the semiconductor memory 1, the area of the pad 17 provided on the semiconductor memory 1 and used for connection with the external memory controller 2 is larger than the area of the pad for connecting the memory chip 1-1 with the circuit chip 1-2.

The descriptions of the above embodiments have assumed that the semiconductor memory 1 has a configuration in which the memory cell transistors MTs including charge accumulation layers are three-dimensionally arranged. However, this is not a limitation. The structures and production processes for the pad area 15 described for the above embodiments can be applied to other semiconductor memories. For example, the structures described for the above embodiments can be applied to semiconductor memories having a configuration in which phase-change memory cells are three-dimensionally arranged, or to semiconductor memories having a configuration in which memory cells using ferroelectric thin-film materials are three-dimensionally arranged.

In the context of the present specification, the term "connection" means electrical connection, and does not exclude, for example, the presence of other elements interposed between the connected elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory comprising:
a substrate;
a control circuit on the substrate;
a first memory cell array disposed above the control circuit, the first memory cell array including a plurality of first conductors stacked in a first direction crossing the substrate, and a first pillar extending through the first conductors and forming intersections with the first conductors, at least one of the intersections being configured to function as a memory cell;
an insulation film disposed above the first memory cell array;
a first external connection electrode configured for connecting with an external memory controller and disposed above the first memory cell array; and
a plurality of first vias respectively extending through the insulation film, respectively overlapping with the first external connection electrode in the first direction, and respectively electrically connecting the first external connection electrode to the control circuit, wherein
the plurality of first vias are arranged in at least one line in a second direction along one side of the substrate crossing the first direction.

2. The memory of claim 1, wherein
the first external connection electrode and the first conductors are insulated from each other.

3. The memory of claim 1, wherein
the control circuit comprises a sense amplifier connected to the first pillar.

4. The memory of claim 1, wherein
the control circuit comprises a row decoder connected to the first conductors.

5. The memory of claim 1, wherein
the control circuit comprises an input/output circuit configured to control communication between the first memory cell array and the external memory controller via the first external connection electrode.

6. The memory of claim 1, further comprising:
a portion to join together opposing metals disposed between the first memory cell array and the control circuit, respectively.

7. The memory of claim 6, wherein
the metals are copper.

8. The memory of claim 1, wherein
the first pillar is absent between the first external connection electrode and the substrate.

9. The memory of claim 8, wherein
ends of the first conductors are provided in a staircase manner and located between the first external connection electrode and the substrate.

10. The memory of claim 9, wherein
the ends are free from connections of conductors for connecting the first memory cell array with the control circuit.

11. The memory of claim 1, further comprising:
a second memory cell array disposed between the control circuit and the first memory cell array, the second memory cell array including a plurality of second conductors stacked in the first direction, and a second pillar extending through the second conductors and forming intersections with the second conductors, each of the intersections being configured to function as a memory cell;
a second external connection electrode disposed above the second memory cell array; and
a plurality of second vias respectively extending through the insulation film, respectively overlapping with the second external connection electrode in the first direction, and respectively electrically connecting the second external connection electrode to the control circuit.

12. The memory of claim 11, wherein
the plurality of first vias and the plurality of second vias are arranged in line in a second direction crossing the first direction.

13. The memory of claim 12, wherein
the second direction is along one side of the substrate.

* * * * *